United States Patent
Vayner et al.

(10) Patent No.: US 8,471,587 B2
(45) Date of Patent: Jun. 25, 2013

(54) LASER TARGETING MECHANISM

(75) Inventors: Vladimir Vayner, Needham, MA (US); Steve Uzdanovich, Tewksbury, MA (US)

(73) Assignee: Teradyne, Inc., North Reading, MA (US)

( * ) Notice: Subject to any disclaimer, the term of this patent is extended or adjusted under 35 U.S.C. 154(b) by 2 days.

(21) Appl. No.: 12/911,141

(22) Filed: Oct. 25, 2010

(65) Prior Publication Data

US 2011/0037982 A1 Feb. 17, 2011

Related U.S. Application Data

(62) Division of application No. 11/875,561, filed on Oct. 19, 2007, now Pat. No. 7,847,570.

(51) Int. Cl.
  *G01R 31/26* (2006.01)
(52) U.S. Cl.
  USPC .................................................. 324/762.01
(58) Field of Classification Search
  USPC ................. 324/762.01–762.1, 754.01–754.3, 324/755.01–755.1; 257/48; 438/14–18
  See application file for complete search history.

(56) References Cited

U.S. PATENT DOCUMENTS

| | | |
|---|---|---|
| 4,527,942 A | 7/1985 | Smith |
| 4,857,009 A | 8/1989 | Christensen |
| 5,091,693 A | 2/1992 | Berry et al. |
| 5,642,056 A * | 6/1997 | Nakajima et al. ........ 324/750.22 |
| 5,812,409 A | 9/1998 | Kanno et al. |
| 5,982,182 A | 11/1999 | Chiu et al. |
| 6,040,691 A | 3/2000 | Hanners et al. |
| 6,040,700 A | 3/2000 | Berar |
| 6,064,217 A * | 5/2000 | Smith ...................... 324/750.25 |
| 6,218,849 B1 | 4/2001 | Kiyokawa et al. |
| 6,242,933 B1 | 6/2001 | Yap |
| 6,271,658 B1 | 8/2001 | Vallinan et al. |
| 6,441,630 B1 | 8/2002 | Obikane et al. |
| 6,462,532 B1 | 10/2002 | Smith |
| 6,489,794 B1 | 12/2002 | Cram |
| 6,586,925 B2 | 7/2003 | Ramesh et al. |
| 6,617,867 B2 | 9/2003 | Bruno et al. |

(Continued)

FOREIGN PATENT DOCUMENTS

WF 2006/132064 12/2006

OTHER PUBLICATIONS

U.S. Appl. No. 11/875,627, Office Action, Jun. 19, 2008, 20 pages.

(Continued)

*Primary Examiner* — Tung X Nguyen
(74) *Attorney, Agent, or Firm* — Fish & Richardson P.C.

(57) ABSTRACT

An automated test equipment system includes a peripheral including first mechanical alignment features; a test head including second mechanical alignment features arranged in a pattern corresponding to the first mechanical alignment features and configured to engage the first mechanical alignment features. The automated test equipment system also includes a laser assisted alignment system including laser devices mounted to the peripheral and operable to emit laser beams; target plates mounted to the test head and including target symbols visible on surfaces of the target plates. The target symbols are arranged in a pattern corresponding to the laser devices such that, when laser beams from the laser devices are substantially aligned with the target symbols, the first mechanical alignment features are substantially aligned with the second mechanical alignment features.

9 Claims, 23 Drawing Sheets

U.S. PATENT DOCUMENTS

| | | |
|---|---|---|
| 6,676,438 B2 | 1/2004 | Zhou et al. |
| 6,744,267 B2 | 6/2004 | Sauk et al. |
| 6,756,800 B2 | 6/2004 | Chiu et al. |
| 6,759,842 B2 | 7/2004 | Weimer |
| 6,819,129 B2 | 11/2004 | Kim et al. |
| 6,836,110 B1 | 12/2004 | Ha et al. |
| 6,844,718 B2 | 1/2005 | Heigl |
| 6,870,360 B2 | 3/2005 | Hwang |
| 6,897,645 B2 | 5/2005 | bin Mohamed Hassan |
| 6,897,670 B2 | 5/2005 | Burns |
| 6,927,587 B2 | 8/2005 | Yoshioka |
| 7,042,239 B1 | 5/2006 | Miller |
| 7,049,577 B2 | 5/2006 | Muller et al. |
| 7,049,843 B2 | 5/2006 | Yakymyshyn et al. |
| 7,109,733 B2 | 9/2006 | Gudin et al. |
| 7,161,347 B1 | 1/2007 | Miller et al. |
| 7,221,175 B2 | 5/2007 | Ramamoorthi |
| 7,276,895 B2 | 10/2007 | Mueller |
| 7,378,862 B2 | 5/2008 | Kolman |
| 7,538,564 B2 * | 5/2009 | Ehrmann et al. ......... 324/754.23 |
| 2002/0063566 A1 | 5/2002 | Bruno et al. |
| 2005/0073296 A1 | 4/2005 | Mueller |
| 2005/0275418 A1 | 12/2005 | Chong et al. |
| 2006/0001435 A1 | 1/2006 | Teneketges |
| 2006/0006892 A1 | 1/2006 | Green et al. |
| 2006/0205253 A1 | 9/2006 | Stowers et al. |
| 2007/0007034 A1 | 1/2007 | Behziz et al. |
| 2007/0096756 A1 | 5/2007 | Parrish et al. |
| 2007/0096758 A1 | 5/2007 | Kolman |
| 2007/0132467 A1 | 6/2007 | Jager |
| 2007/0152695 A1 | 7/2007 | Bosy et al. |

OTHER PUBLICATIONS

U.S. Appl. No. 11/875,627, Amendment in Reply, Oct. 17, 2008, 16 pages.
U.S. Appl. No. 11/875,627, Final Office Action, Jan. 9, 2009, 20 pages.
U.S. Appl. No. 11/875,627, Amendment in Reply, Feb. 18, 2009, 18 pages.
U.S. Appl. No. 11/875,627, Final Office Action, Mar. 11, 2009, 10 pages.
U.S. Appl. No. 11/875,627, Amendment in Reply, May 8, 2009, 13 pages.
U.S. Appl. No. 11/875,627, Office Action, Aug. 17, 2009, 8 pages.
U.S. Appl. No. 11/875,627, Amendment in Reply, Dec. 10, 2009, 14 pages.
U.S. Appl. No. 11/875,561, Office Action, Oct. 29, 2009.
U.S. Appl. No. 11/875,561, Amendment in Reply, Jan. 29, 2010.

* cited by examiner

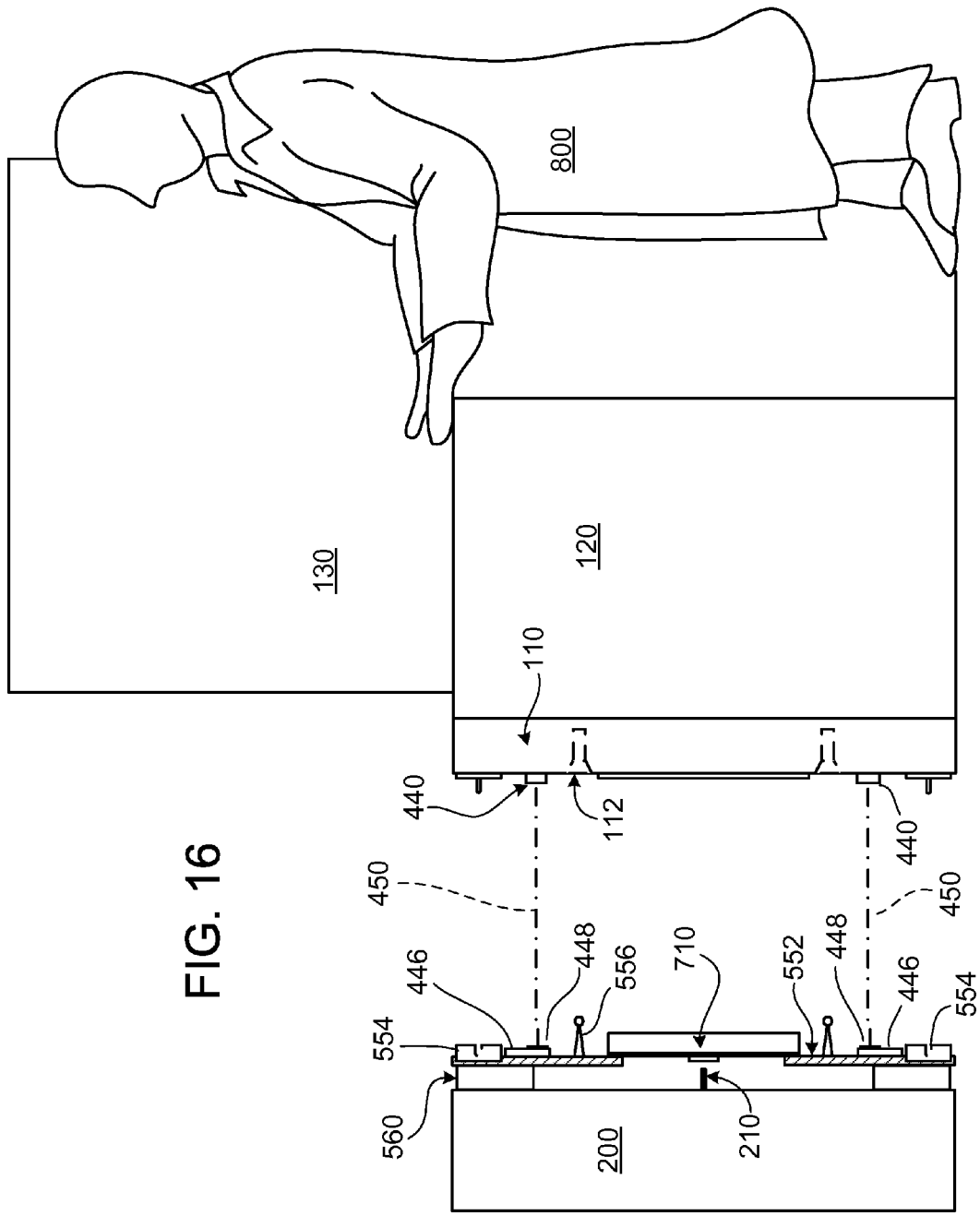

ately moving devices to and from a test site that is in electrical
LASER TARGETING MECHANISM This application is a divisional of and claims the benefit of priority from U.S. application Ser. No. 11/875,561, filed Oct. 19, 2007 now U.S. Pat. No. 7,847,570, which is incorporated herein by reference in its entirety.

TECHNICAL FIELD

This disclosure relates to automated test equipment, and more particularly to laser targeting mechanisms for automated test equipment.

BACKGROUND

Automated test equipment (ATE), e.g., for testing integrated circuit devices, typically includes a tester and a peripheral. Testers generally include hardware and software for generating and measuring electrical signals to determine whether a particular device under test (DUT) functions properly. Peripherals generally include mechanisms for automatically moving devices to and from a test site that is in electrical communication with the tester. Examples of peripherals include both handlers and probers. Handlers are used for conveying semiconductor devices after they have been packaged. Probers are used for conveying semiconductor devices that are being tested while still in wafer form. The tester and peripheral operate cooperatively to test devices in succession.

The tester and the peripheral are usually tied together through an interface that includes a device interface board (DIB) assembly. The DIB assembly provides an electrical and mechanical interface between the tester and peripheral. In particular, the peripheral delivers a device for test to the DIB assembly, and the DIB assembly provides the electrical interface with the test head that allows the tester to execute a test algorithm on that device. In use, the DIB assembly can be attached to the peripheral, and then the test head can be aligned with the peripheral using a portion of the tester called a manipulator, which allows for physical positioning of the test head. Once aligned the test head and peripheral are mechanically connected, or "docked", via the DIB assembly and the process of testing can begin.

SUMMARY

In general, in an aspect, an automated test equipment interface system, e.g., for attaching a handler to a test head, includes a device interface board assembly. The device interface board assembly includes a stiffener frame having a frame body that is configured for attachment to a test head, alignment brackets connected to the frame body, and cam followers connected to the alignment brackets. The system also includes a docking device. The docking device includes a docking plate that is configured for attachment to a handler, pull-down ramps connected to the docking plate and movable between a retracted position and an extended position, an actuator operable to initiate movement of the pull-down ramps, and a coupling that translates movement of the actuator to corresponding movements of the pull-down ramps. The pull-down ramps can include cam surfaces that are configured to engage the cam followers of the device interface board assembly during movement between the retracted and extended positions to pull the device interface board assembly towards the docking plate.

Implementations may include one or more of the following features. The alignment brackets include alignment bushings, and the docking device includes alignment pins extending outwardly from a first surface of the docking plate and configured to engage the alignment bushings for alignment of the pull-down ramps relative to the cam followers. The system includes an automated test equipment (ATE) handler. The docking plate is mounted to the ATE handler. The device interface board assembly includes a device interface board mounted to the stiffener frame. The device interface board includes a socket configured to receive a device to be tested. The alignment brackets establish a predetermined dimensional relationship between the socket and the docking plate when the stiffener frame is connected to the docking plate. The system includes capture position sensors connected to the docking plate and operable to detect a presence of the device interface board assembly in a capture position in which the cam surfaces of the pull-down ramps are substantially aligned with the cam followers of the device interface board assembly such that the pull-down ramps are moveable to engage the cam surfaces with the cam followers of the device interface board assembly. The system includes a display panel mounted to the docking plate and electrically connected to the capture position sensor. The display panel is configured to provide a visual indication to signal a detected presence of the device interface board assembly in the capture position based on signals received from the capture position sensors. The capture position sensors include reflective sensors operable to detect reflective surfaces on the device interface board assembly. The system includes a docked position sensor connected to the docking plate. The pull-down ramps are operable to displace the device interface board assembly from the capture position toward a docked position such that the device interface board assembly is closer to the docking plate in the docked position. The docked position sensor is operable to detect a presence of the device interface board assembly in the docked position. The docked position sensor is electrically connected to the display panel. The display panel is configured to provide a visual indication to signal a detected presence of the device interface board assembly in the docked position based on signals received from the docked position sensor. The system includes a test head. The device interface board assembly is mounted to the test head. The system includes a safety interlock bracket rotatably mounted to the docking plate. The safety interlock bracket is rotatable between a locked position in which the safety interlock bracket substantially inhibits movement of the pull-down ramps in at least one direction, and an unlocked position in which the interlock bracket does not substantially inhibit movement of the pull-down ramps. A first one of the alignment brackets includes a through-hole extending from a first surface of the alignment bracket to a second surface of the alignment bracket, and a spring loaded pin disposed within the through-hole and displaceable from a first position in which a first end of the pin extends outwardly from the first surface of the alignment bracket to a second position in which a second end of the pin extends outwardly from the second surface of the alignment bracket. The pin is biased towards the first position. The pin is operable to rotate the safety interlock bracket to the unlocked position when the stiffener frame is connected to both a test head and the docking device.

In general, in an aspect, a docking device, e.g., for connecting a device interface board (DIB) assembly to an automated test equipment (ATE) handler. The docking device includes a docking plate configured for attachment to an ATE handler; pull-down ramps connected to the docking plate and movable between a retracted position and an extended position, an actuator operable to initiate movement of the pull-down ramps; and a coupling that translates movement of the actuator to corresponding movements of the pull-down ramps. The pull-down ramps include cam surfaces configured to engage cam followers of a DIB assembly during movement between the retracted and extended positions to pull the DIB assembly towards the docking plate.

Implementations may include one or more of the following features. The docking device includes alignment pins extending outwardly from a first surface of the docking plate and arranged in a pattern corresponding to alignment bushings on a DIB assembly. The docking plate includes through-holes arranged in a pattern corresponding to mounting holes on an ATE handler. The docking device includes capture position sensors connected to the docking plate and operable to detect a presence of a DIB assembly in a capture position in which the cam surfaces of the pull-down ramps are substantially aligned with cam followers of the DIB assembly such that the pull-down ramps are moveable to engage the cam surfaces with the cam followers of the DIB assembly. The docking device includes a display panel mounted to the docking plate and electrically connected to the capture position sensors. The display panel is configured to provide a visual indication to signal a detected presence of a DIB assembly in the capture position based on signals received from the capture position sensors. The capture position sensors include reflective sensors operable to detect reflective surfaces on a DIB assembly. The docking device includes a docked position sensor connected to the docking plate. The pull-down ramps are operable to displace a DIB assembly from the capture position toward a docked position such that the DIB assembly is closer to the docking plate in the docked position. The docked position sensor is operable to detect a presence of a DIB assembly in the docked position. The docked position sensor is electrically connected to the display panel. The display panel is configured to provide a visual indication to signal a detected presence of a DIB assembly in the docked position based on signals received from the docked position sensor. The actuator includes a lock-out mechanism that is displaceable between an engaged position in which operation of the actuator and corresponding movement of the pull-down ramps is inhibited, and a disengaged position in which the actuator is operable to initiate movement of the pull-down ramps. The lock-out mechanism is resiliently biased towards the engaged position. The pull-down ramps include first pull-down ramps and second pull-down ramps, and wherein the coupling translates movement of the actuator to corresponding movements of the first and second pull-down ramps in opposite directions relative to each other. The docking device includes first and second gear racks slidably mounted to the docking plate; a first one of the pull-down ramps connected to the first gear rack; a second one of the pull-down ramps connected to the second gear rack; and a first pinion gear rotatably mounted to the docking plate and mechanically connecting the first and second gear racks such that motion of the first gear rack in a first direction causes motion of the second gear rack in a second direction opposite the first direction. The docking device includes a first linear bearing connected to the docking plate. The first and second gear racks are slidably mounted to the first linear bearing. The docking device includes third and fourth gear racks slidably mounted to the docking plate; a third one of the pull-down ramps connected to the third gear rack; a fourth one of the pull-down ramps connected to the fourth gear rack; a second pinion gear rotatably mounted to the docking plate and mechanically connecting the third and four gear racks such that motion of the third gear rack in the first direction causes motion of the fourth gear rack in the second direction; and a drive plate connecting the first and third gear racks. The drive plate is movable relative to the docking plate to induce movement of the gear racks. The drive plate includes a drive slot. The actuator includes a cam plate rotatably mounted to the docking plate; and a first cam follower connected to the cam plate. The first cam follower engages the drive slot to translate rotatational movement of the cam plate to corresponding linear movement of the drive plate. The actuator includes a handle connected to the cam plate and operable to control rotational movement of the cam plate. The actuator includes a hub lever fixedly mounted to the docking plate. The cam plate is rotatable about the hub lever. The handle is displaceable relative to the hub lever between an engaged position in which the handle mechanically engages the hub lever thereby inhibiting rotational movement of the cam plate, and a disengaged position in which the handle is operable to control rotational movement of the cam plate. The handle is resiliently biased towards the engaged position. The docking device includes a safety interlock bracket rotatably mounted to the docking plate. The safety interlock bracket is rotatable between a locked position in which the safety interlock bracket mechanically engages the first pull-down ramp thereby inhibiting linear movement of the first gear rack in at least one direction, and an unlocked position in which the interlock bracket is disengaged from the first pull-down ramp. The first pull-down ramp includes a stop block. The safety interlock bracket mechanically engages the stop block when the safety interlock bracket is in the locked position. The safety interlock bracket is resiliently biased towards the locked position. The docking device includes a first lead screw rotatably mounted to the docking plate; first and second nuts mounted to the first lead screw; a first one of the pull-down ramps connected to the first nut; and a second one of the pull-down ramps connected to the second nut. Rotational movement of the first lead screw induces linear movement of the first nut in a first direction and linear movement of the second nut in a second direction opposite the first direction. The docking device includes a second lead screw rotatably mounted to the docking plate; third and fourth nuts mounted to the second lead screw; a third one of the pull-down ramps connected to the third nut; and a fourth one of the pull-down ramps connected to the fourth nut. Rotational movement of the second lead screw induces linear movement of the third nut in the first direction and linear movement of the fourth nut in the second direction. The first lead screw and the second lead screw are mechanically interconnected such that movements of the first, second, third and fourth nuts are substantially synchronized. The first lead screw and the second lead screw are mechanically interconnected with a drive belt. The docking device includes a drive shaft; and a motor drivably connected to the drive shaft. The first and second lead screws are each mechanically connected to the drive shaft such that rotation of the drive shaft induces rotational motion of the first and second lead screws.

In general, in an aspect, a device interface board assembly for providing a mechanical connection between a docking plate and a test head. The device interface board assembly includes a stiffener frame including a frame body configured for attachment to a test head; alignment brackets connected to the frame body; cam followers connected to the alignment brackets and arranged in a pattern corresponding to cam slots on a docking plate. The alignment brackets establish a predetermined dimensional relationship between the stiffener frame and the docking plate when the stiffener frame is connected to the docking plate.

Implementations may include one or more of the following features. The device interface board assembly includes a device interface board mounted to the stiffener frame. The device interface board includes a socket configured to receive a device to be tested. The alignment brackets establish a predetermined dimensional relationship between the socket and the docking plate when the stiffener frame is connected to the docking plate. The alignment brackets include alignment bushings arranged in a pattern corresponding to alignment pins on a docking plate for alignment of the cam followers relative to cam slots of the docking plate. A first one of the alignment brackets includes a through-hole extending from a first surface of the alignment bracket to a second surface of the alignment bracket, and a spring loaded pin disposed within the through-hole and displaceable from a first position in which a first end of the pin extends outwardly from the first surface of the alignment bracket to a second position in which a second end of the pin extends outwardly from the second surface of the alignment bracket. The pin is biased towards the first position.

In general, in an aspect, a method of testing electronic devices. The method includes mounting a device interface board assembly to a test head; aligning the test head with a handler; moving the moving the test head and the attached device interface board assembly from a first position relative to the handler to a second position relative to the handler; and then mechanically connecting the device interface board assembly to the handler thereby interconnecting the handler and the test head.

Implementations may include one or more of the following features. Aligning includes moving the test head and attached device interface board assembly with a manipulator. The handler includes an interface docking plate mounted to a first surface of the handler. Mechanically connecting the device interface board assembly to the handler includes connecting the device interface board assembly to the docking plate. The device interface board assembly includes cam followers. The interface docking plate includes pull-down ramps that are movable between a retracted position and an extended position. The pull-down ramps include cam surfaces configured to engage the cam followers of the device interface board assembly during movement between the retracted and extended positions to pull the device interface board assembly towards the handler. Mechanically connecting the device interface board assembly to the handler comprises engaging the cam surfaces with the cam followers. The docking plate includes a handle that is operable to control movements of the pull-down ramps, and engaging the cam surfaces with the cam followers includes moving the handle from a first position corresponding to the refracted position of the pull-down ramps toward a second position corresponding to the extended position of the pull-down ramps. The method includes changing a Z-stack value without removing the interface docking plate from the handler. The Z-stack value corresponds to a distance between the handler and a test socket, electrically connected to the test head, when the test head is interconnected with the handler. Changing the Z-stack value includes removing the device interface board assembly from the test head; and then mounting a second, different device interface board assembly to the test head.

In general, in an aspect, an automated test equipment system includes a peripheral including first mechanical alignment features; a test head including second mechanical alignment features arranged in a pattern corresponding to the first mechanical alignment features and configured to engage the first mechanical alignment features. The automated test equipment system also includes a laser assisted alignment system including laser devices mounted to the peripheral and operable to emit laser beams; target plates mounted to the test head and including target symbols visible on surfaces of the target plates. The target symbols are arranged in a pattern corresponding to the laser devices such that, when laser beams from the laser devices are substantially aligned with the target symbols, the first mechanical alignment features are substantially aligned with the second mechanical alignment features.

Implementations may include one or more of the following features. The peripheral includes a first surface; and a docking plate mounted to the first surface. The first mechanical alignment features are mounted to the docking plate. The laser devices are mounted to the docking plate. The test head includes a first surface; and a device interface board assembly (DIB) assembly mounted to the first surface. The second mechanical alignment features are mounted to the DIB assembly. The target plates are mounted to the first surface of the test head in positions spaced apart from the device interface board assembly. The target plates include spirit levels. The laser alignment system provides for alignment of first mechanical alignment features with the second mechanical alignment features in five degrees-of-freedom. The first mechanical alignment features include alignment pins. The second mechanical alignment features include bushings configured to engage the alignment pins. The peripheral is a handler or a prober. The test head includes first mechanical interlock features. The peripheral includes second mechanical interlock features configured to couple with the first mechanical interlock features when the test head is connected to the peripheral in a docked position, a docked position sensor operable to detect the test head in the docked position, and control electronics electrically connected to the docked position sensor and the laser devices and configured to inhibit operation of laser devices upon receiving signals from the docked position sensor indicating that test head is in the docked position. The first mechanical interlock features include cam followers. The second mechanical interlock features include cam surfaces configured to interface with the cam followers. The test head includes a first surface; and a device interface board (DIB) assembly mounted to the first surface. The first mechanical interlock features are mounted to the DIB assembly. The peripheral includes a first surface and a docking plate mounted to the first surface. The second mechanical interlock features are mounted to the docking plate.

In general, in an aspect, an automated test equipment system includes a peripheral including first mechanical alignment features; and a test head including second mechanical alignment features arranged in a pattern corresponding to the first mechanical alignment features and configured to engage the first mechanical alignment features. The automated test equipment system also includes a laser assisted alignment system including target plates mounted to the peripheral and including target symbols visible on surfaces of the target plates, and laser devices mounted to the test head and operable to emit laser beams. The laser devices are arranged in a pattern corresponding to the target symbols such that, when laser beams from the laser devices are substantially aligned with the target symbols, the first mechanical alignment features are substantially aligned with the second mechanical alignment features.

Implementations may include one or more of the following features. The peripheral includes a first surface; and a docking plate mounted to the first surface. The first mechanical alignment features are mounted to the docking plate. The target plates are mounted to the docking plate. The test head includes a first surface; and a device interface board assembly (DIB) assembly mounted to the first surface. The second mechanical alignment features are mounted to the DIB assembly. The laser devices are mounted to the first surface of the test head in positions spaced apart from the DIB assembly.

The target plates include spirit levels. The laser alignment system provides for alignment of first mechanical alignment features with the second mechanical alignment features in five degrees-of-freedom. The first mechanical alignment features include alignment pins. The second mechanical alignment features include bushings configured to engage the alignment pins. The peripheral is a handler or a prober. The peripheral is a vertically oriented peripheral configured for testing electronic components in a vertical orientation.

These aspects and features and other combinations of these and other aspects and features can be expressed as methods, apparatus, systems, and as means for performing functions, and in other ways.

Other features and advantages will be apparent from the description and the claims.

DESCRIPTION OF DRAWINGS

FIG. 16 shows another embodiment of an automated test equipment (ATE) system with a laser assisted alignment system.

Like reference symbols in the various drawings indicate like elements.

DETAILED DESCRIPTION

System Overview

Figure 1:
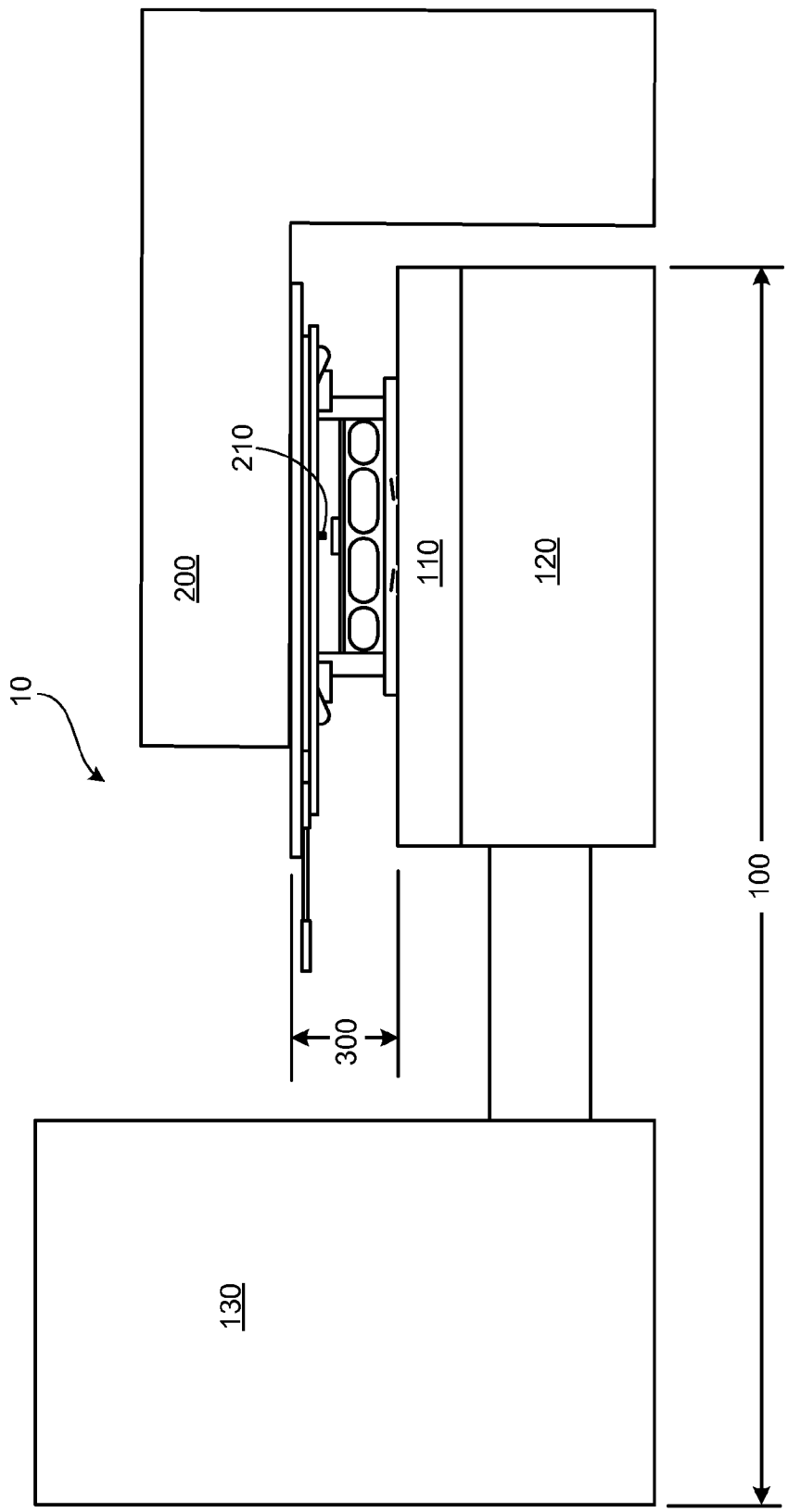
FIG. 1 is a schematic view of an automated test equipment (ATE) system.

Automated Test Equipment (ATE) systems are used to test electronic devices such as integrated circuits. Referring to FIG. 1, an ATE system 10 includes a tester 100, a handler 200, and an interface system 300. The interface system 300 provides a connection between the tester 100 and the handler 200. The tester 100 includes electronic hardware and software for applying signals to a device under test (DUT) to determine whether the device operates as intended. The tester 100 includes a test head 110, a manipulator 120 which supports the test head 110 and allows for positioning of the test head 110, and a cabinet 130 which provides the test head 110 with electrical power and cooling (e.g., liquid and/or forced air cooling).

Figure 2:
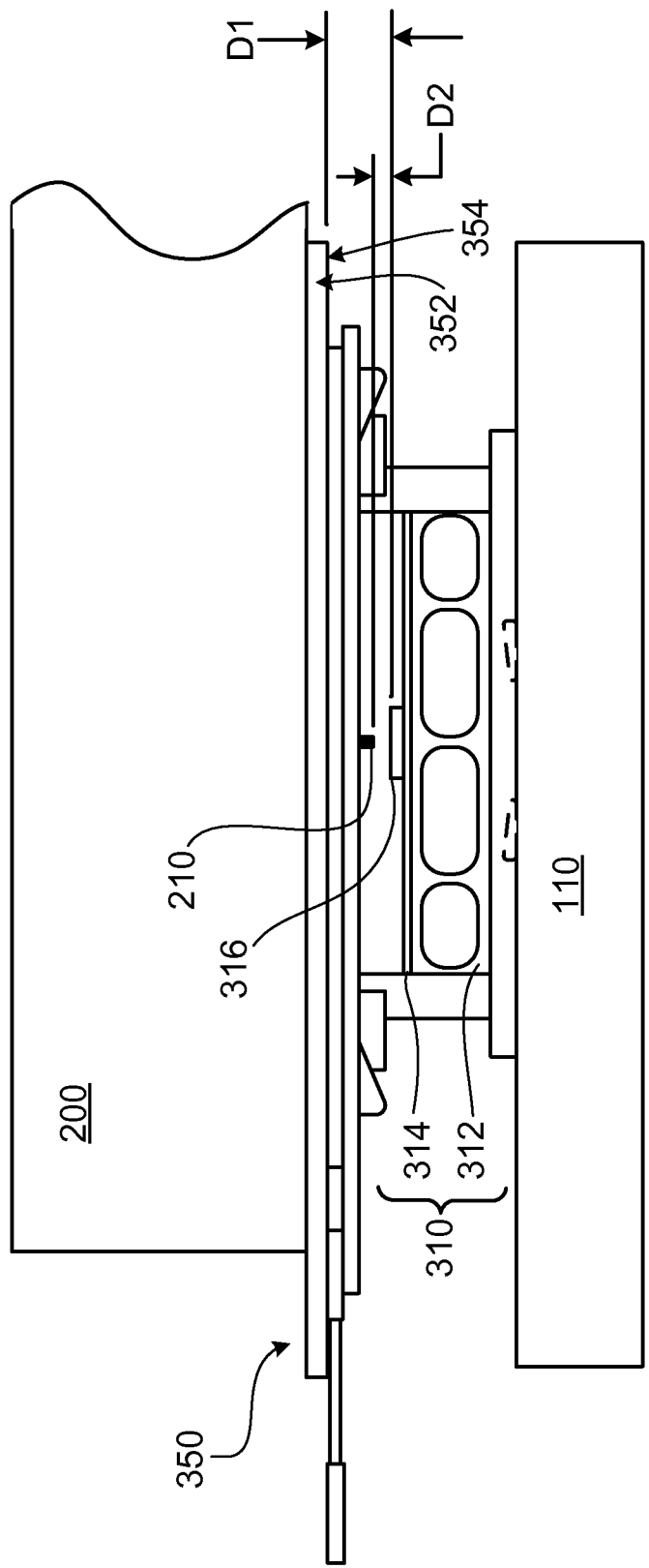
FIG. 2 is a schematic side view of an interface system.

As shown in greater detail in FIG. 2, the interface system 300 includes a device interface board (DIB) assembly 310 and a docking device 350. The DIB assembly 310 includes a stiffener 312, a printed circuit board (PCB) 314 carrying a socket 316 for receiving a device under test (DUT) (e.g., an electronic device or component to be tested), and electrical contacts for delivering signals between the test head 110 and the socket 316. The docking device 350 is mounted to the handler 200 (e.g., with screws and/or clamps) and provides a means for connecting the DIB assembly 310 to the handler 200. The handler 200 includes an arm 210 that physically places (and removes) DUTs in the socket 316 so that they can be measured by the test head 110.

Device Interface Board (DIB) Assembly

Figure 3A:
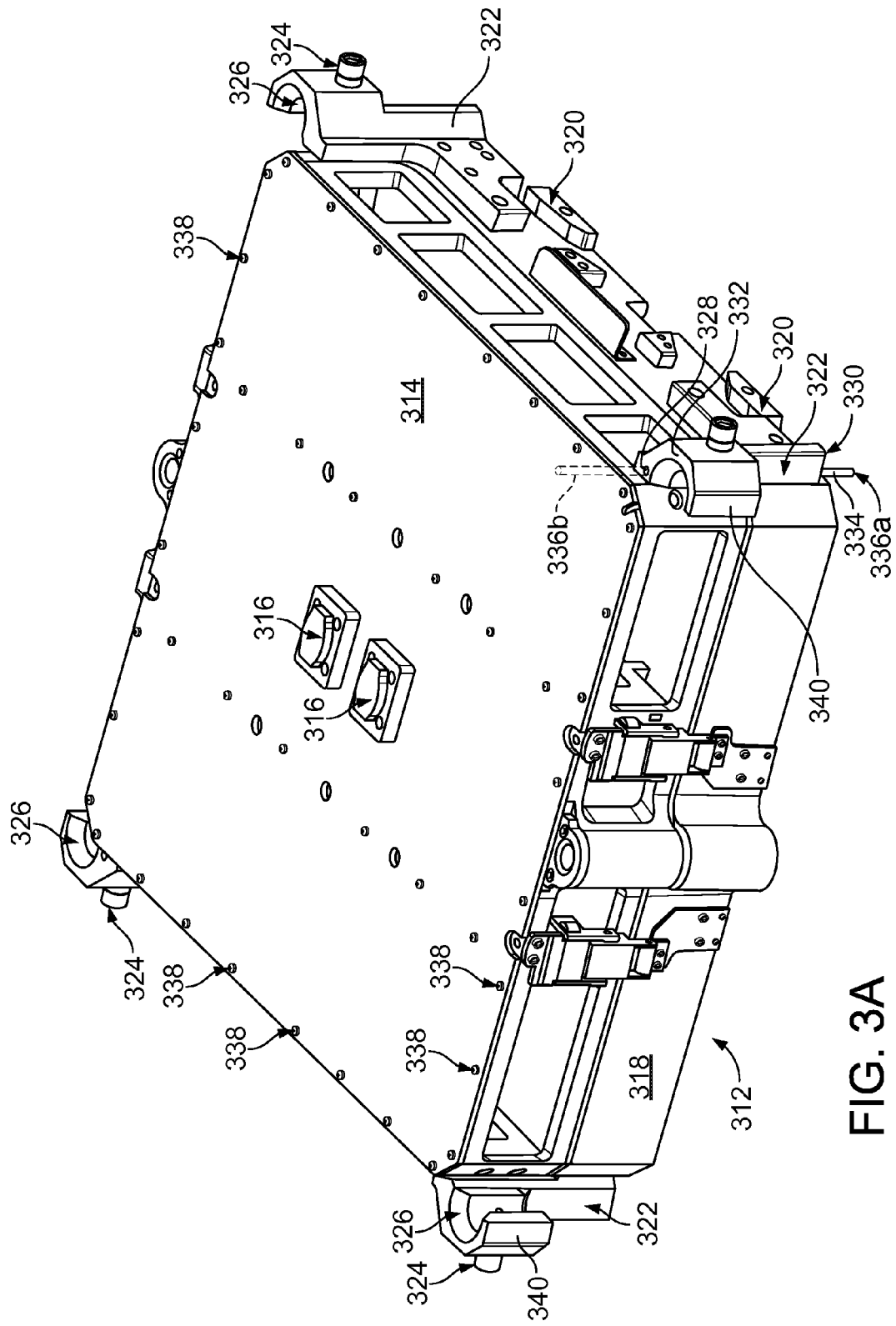
FIG. 3A is a perspective view of a device interface board (DIB) assembly.

As shown in FIG. 3A, the DIB assembly 310 includes a stiffener frame 312 that is configured for attachment to a test head 110. For example, as shown in FIG. 3A, the stiffener frame 312 includes a frame body 318 having lower cam surfaces (ramps) 320 for engaging corresponding cam followers (not shown) on the test head 110; i.e, for mounting the DIB assembly 310 to the test head 110. The stiffener frame 312 also includes alignment brackets 322 connected to the frame body 318. The alignment brackets 322 can be separate pieces mechanically fastened (e.g., with screws) to the frame body 318, as shown in FIG. 3A. The stiffener frame 312 also includes cam followers 324, which are connected to the alignment brackets 322. The alignment brackets 322 include alignment bushings 326, which, as discussed in greater detail below, aid in aligning the DIB assembly 310 with the docking device 350.

As shown in FIG. 3A, one of the alignment brackets 322 (lower right) includes a through-hole 328 that extends from a first surface 330 of the alignment bracket 322 to a second surface 332 of the alignment bracket 322. A spring loaded pin 334 is disposed within the through-hole 328. The spring loaded pin 334 is displaceable from a first position in which a first end 336a of the pin 334 extends outwardly from the first surface 330 of the alignment bracket 322 to a second position (shown in hidden lines) in which a second end 336b of the pin 334 extends outwardly from the second surface 332 of the alignment bracket 322. The pin 334 is resiliently biased toward the first position, however, when connected to the test head 110, the presence of the test head 110 at or near the first surface 330 of the alignment bracket 322 forces the spring loaded pin 334 upwardly, towards the second position. As described in greater detail below, the spring loaded pin 334 operates to disengage a safety lockout feature on the docking device 350 when the DIB assembly 310 is connected to both the docking device 350 and the test head 110.

The DIB assembly 310 also includes a printed circuit board (PCB) 314 that is mounted to the frame body 318, e.g., with screw fasteners 338. As previously mentioned, the PCB 314 carries one or more sockets 316 for receiving DUTs from the handler 200. As shown in FIG. 2, when connected to the docking device 350, the alignment brackets 322 establish a predetermined dimensional relationship D1 between a first surface 354 of the docking device 350 and the socket(s) 316. In particular, the alignment brackets 322 establish a Z-stack value which corresponds to the dimension D2 between the handler arm 210 and the socket(s) 316 when the DIB assembly 310 is docked with the handler 200.

Figure 3B:
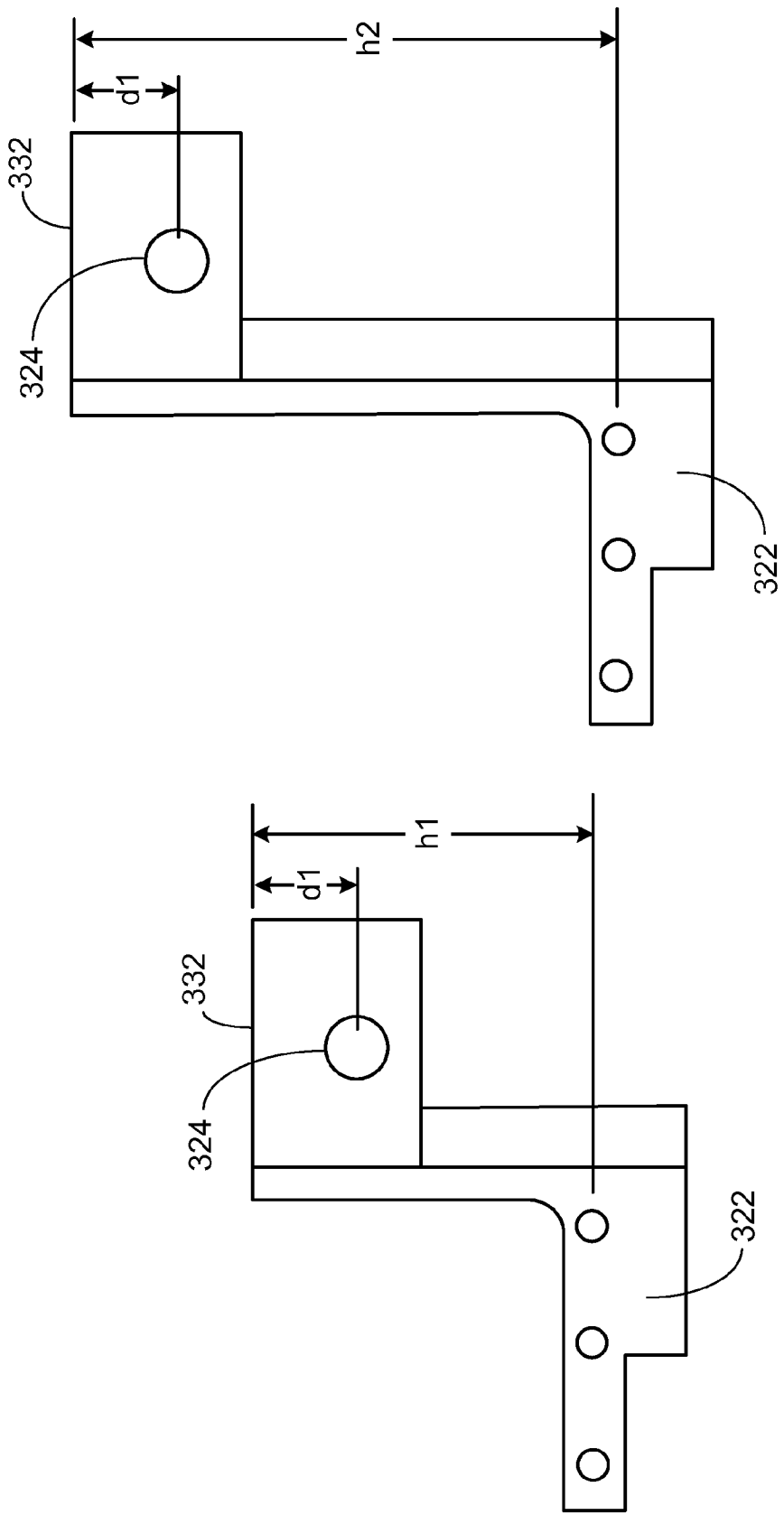
FIG. 3B is a side view of two configurations of an alignment bracket.

Handlers are generally configured to be compatible with a variety of different types of IC packages. And on many handlers, the handler arm 210 always returns to the same relative position, e.g., when feeding DUTs into a socket on a docked DIB assembly. However, component dimensions and pinouts often differ for different types of IC packages. For example, some components have a lower profile (z dimension) than others. Some components have more pins (electrical I/O) than others and require greater insertion forces for ensuring electrical connection with a test socket. For these reasons, the Z-stack value often changes for each type of IC package that is tested. The Z-stack also changes when space is required for additional circuitry. Thus, although many handlers may be configured to be compatible with many different types of IC packages, generally only one configuration is possible at a time, and, often, significant effort and down time are required to reconfigured the handler for testing a different type of IC package. In some cases, reconfiguration of a handler can require removal and reconfiguration of a docking plate (e.g., in order to adjust the Z-stack value) as well as the removal and replacement of one DIB assembly for another. However, by providing alignment brackets 322 which establish the Z-stack value, both the test socket and the Z-stack value can be reconfigured merely by replacing one DIB assembly that is configured for a first type of IC package with another DIB assembly that is configured for a second, different type of IC package to be tested. As shown by comparison in FIG. 3B, the distance d1 between the cam follower 324 and the top surface 332 of the alignment bracket 322 are typically the same for each configuration; however, the height h1, h2 of the alignment bracket 322 is customized to match the specific Z-stack value.

Interface Docking Device

Figure 4A:
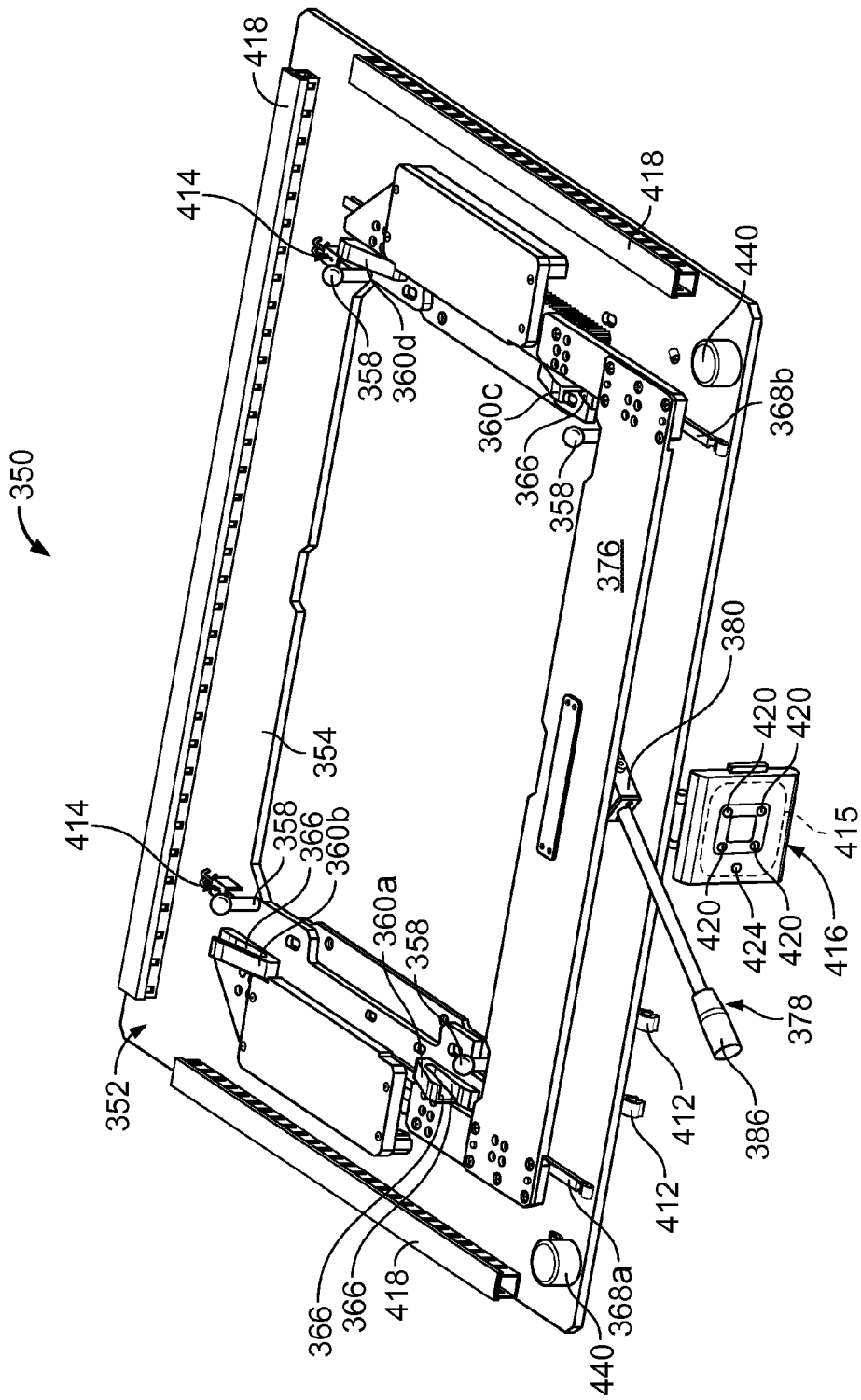
FIGS. 4A and 4B are perspective views of a docking device.
Figure 4B:
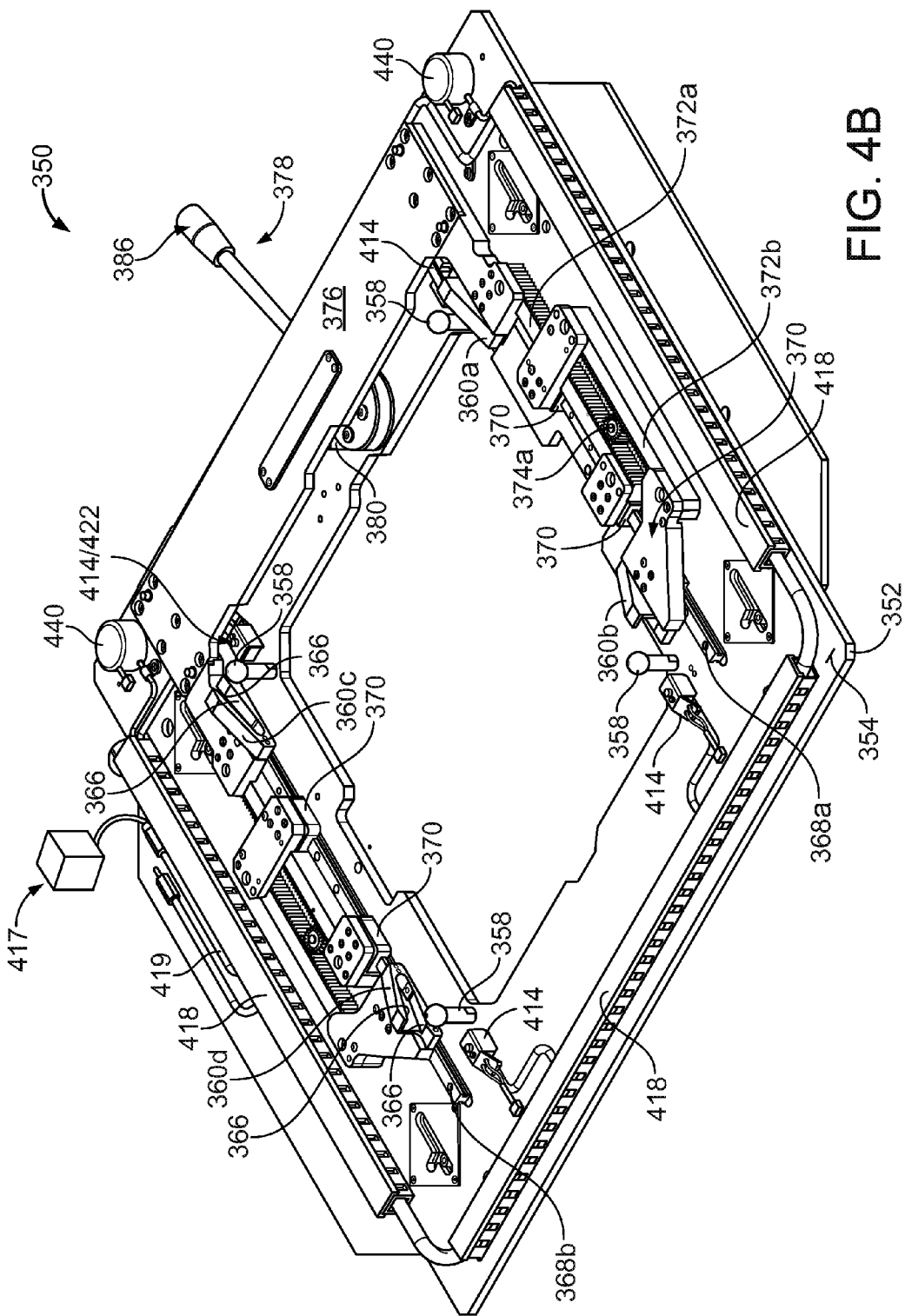
Figure 5:
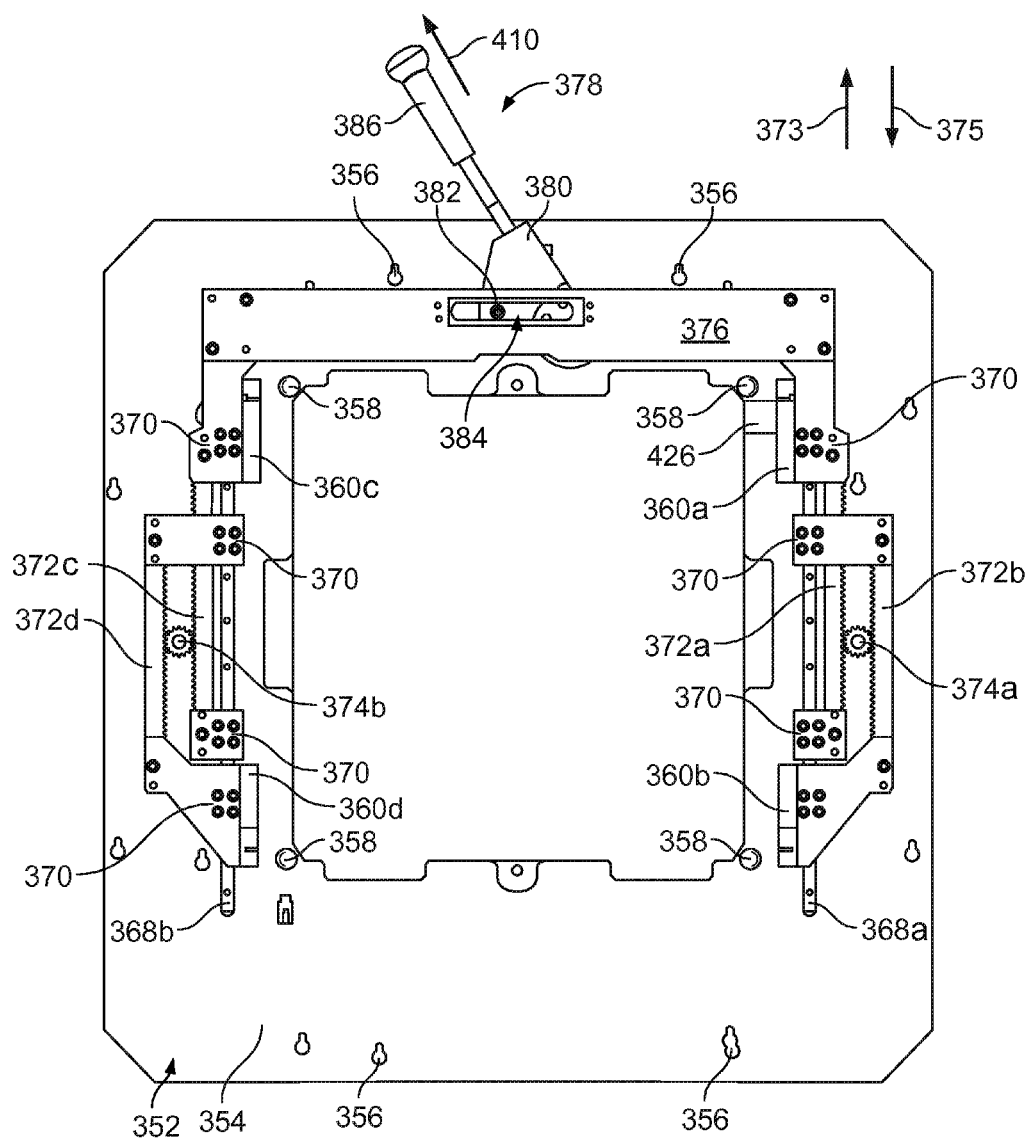
FIG. 5 is a bottom view of the docking device of FIGS. 4A and 4B.

Referring to FIGS. 4A, 4B and 5, the docking device 350 includes a docking plate 352 that is configured for attachment to the handler 200. In particular, the docking plate 350 includes through-holes 356 which are arranged in a pattern that corresponds to mounting holes (not shown) on the handler 200. Thus, the docking plate 352 can be mounted to the handler 200 with screw fasteners.

The docking device 350 includes rough alignment pins 358 which extend outwardly from a first surface 354 of the docking plate 352. The rough alignment pins 358 are arranged in a pattern corresponding to the alignment bushings 326 (FIG. 3A) on the DIB assembly 310, and are configured to cooperatively engage the alignment bushings 326 for alignment of the DIB assembly 310 relative to the docking plate 352. The docking device 350 also includes pull-down ramps 360a-d that are connected to the docking plate 352 and mounted for movement between a retracted position and an extended position. The pull-down ramps 360a-d include cam surfaces 366 that are configured to cooperatively engage the cam followers 324 of the DIB assembly 310 during movement between the retracted and extended positions to pull the DIB assembly 310 towards the docking plate 352 and into a docked position (as shown in FIG. 2).

As shown in the embodiment depicted in FIGS. 4A, 4B and 5, a pair of linear bearings 368a, 368b are mounted to the docking plate 352. Each of the linear bearings 368a, 368b include bearing blocks 370, which are linearly displaceable along the bearings 368a, 368b. Each of the pull-down ramps 360a-d is connected to an associated one of the bearing blocks 370. The docking device 350 also includes a plurality of gear racks 372a-d (four (4) shown). On a first side of the docking plate 352 first and second gear racks 372a, 372b are connected to corresponding ones of the bearing blocks 370 and are thus slidably mounted to the docking plate 352 (i.e., via a first one of the linear bearings 368a). A first pinion gear 374a is rotatably mounted to the docking plate 352 and mechanically connects the first and second gear racks 372a, 372b such that motion of the first gear rack 372a in a first direction (arrow 373) causes motion of the second gear rack 372b in a second direction (arrow 375) that is opposite the first direction 373. Similarly, on a second side of the docking plate 352, third and fourth gear racks 372c, 372d are connected to corresponding ones of the bearing blocks 370 and are thus slidably mounted to the docking plate 352 via a second one of the linear bearings 368b. A second pinion gear 374b is rotatably mounted to the docking plate 352 and mechanically connects the third and fourth gear racks 372c, 372d such that motion of the third gear rack 372c in the first direction (arrow 373) causes motion of the fourth gear rack 372d in the second direction (arrow 375).

A drive plate 376 connects the first and third gear racks 372a, 372c via corresponding ones of the bearing blocks 370. The drive plate 376 is movable relative to the docking plate 352 to induce movement of the gear racks 372a-d. As shown, for example, in FIGS. 4A, 4B and 5, the drive plate 376 is drivably connected to an actuator 378 which is operable to control movement of the drive plate 376 and, as a result, corresponding movements of the pull-down ramps 360a-d. The actuator 378 includes a cam plate 380 which is rotatably mounted to the docking plate 352. The cam plate 380 includes a first cam follower 382 which engages a drive slot 384 in the drive plate 376 to translate rotational movement of the cam plate 380 to corresponding linear movement of the drive plate 376. The actuator 378 also includes a handle 386 that is connected to the cam plate 380. The handle 386 is operable to control rotational movement of the cam plate 380.

Figure 6A:
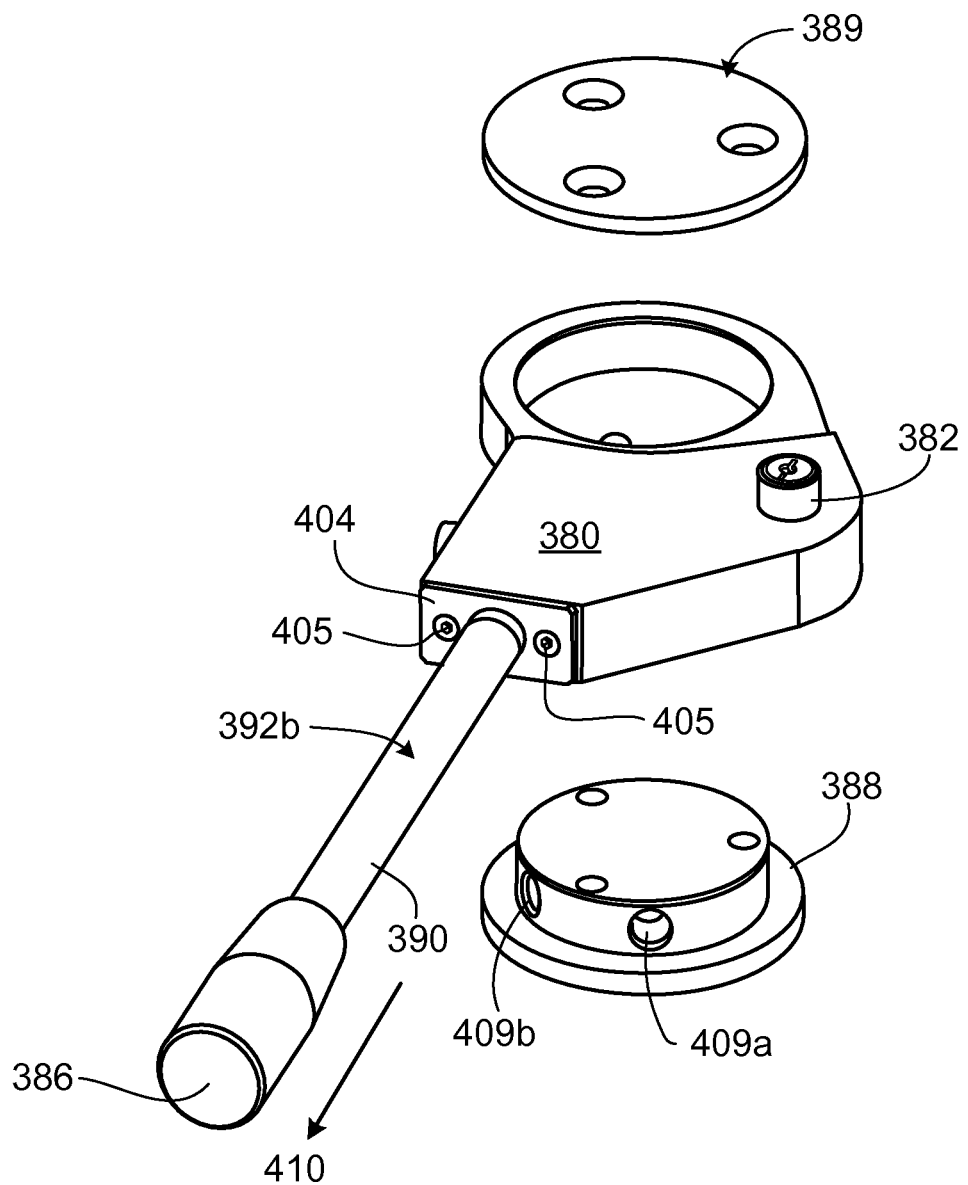
FIGS. 6A and 6B are perspective views of an actuator assembly.
Figure 6B:
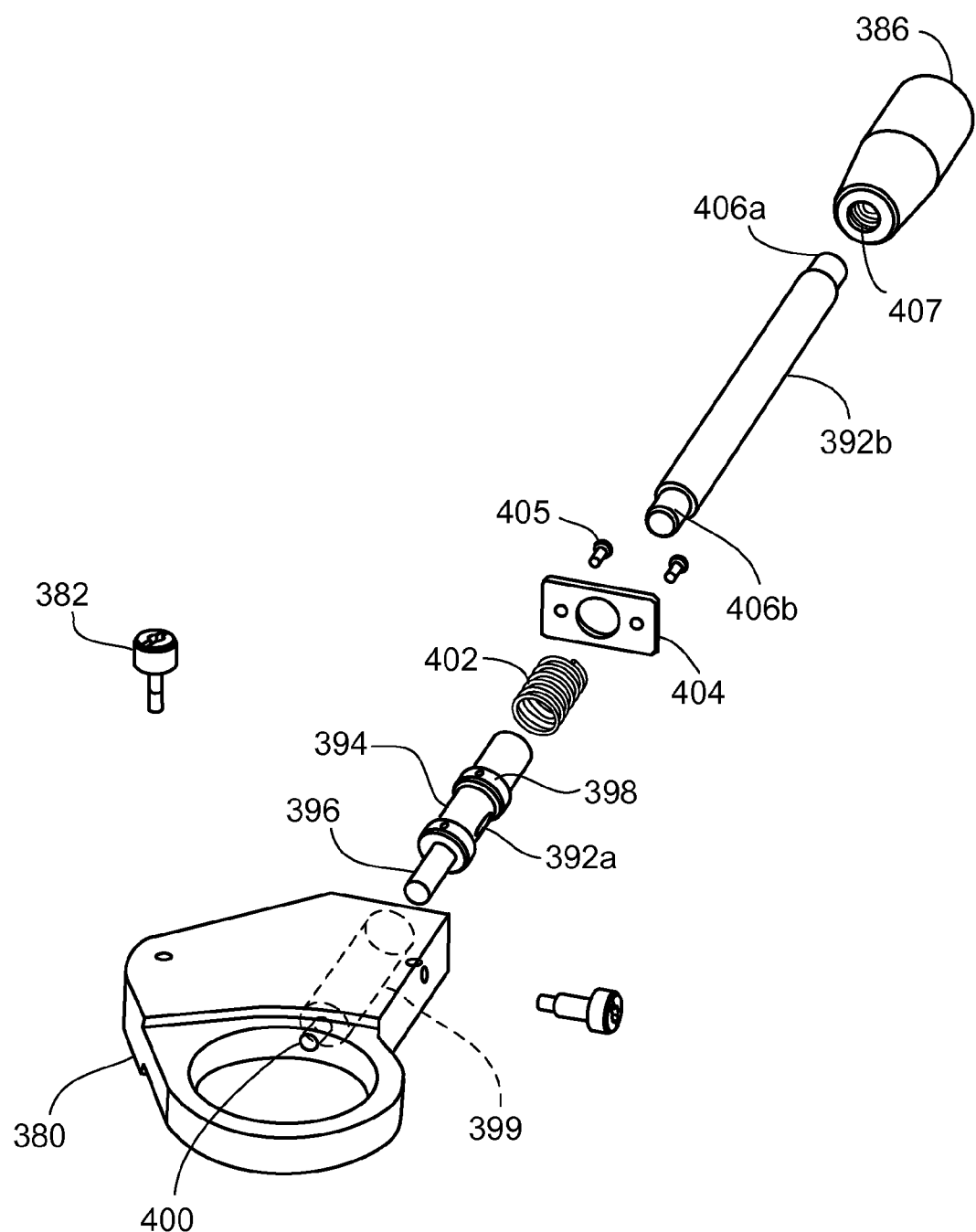

As shown in greater detail in FIGS. 6A and 6B, the actuator 378 also includes a hub lever 388 that is fixedly mounted to the docking plate 352. The cam plate 380 is rotatable about the hub lever 388 and secured thereto by a hub cover 389. The handle 386 is connected to cam plate 380 with a spring loaded shaft 390. As shown in FIG. 6B, the spring loaded shaft 390 includes a first shaft portion 392a and a second shaft portion 392b. The first shaft portion 392a includes a body 394 having a stem 396 and a shoulder 398. When assembled, the first shaft portion 392a is substantially disposed in a counter-bored hole 399 in the cam plate 380 with the stem 396 extending into a though hole 400 in the cam plate 380. A spring 402 is disposed about an end of the first shaft portion 392a opposite the stem 396 and rests against the shoulder 398. The spring 402 is held within the counter-bored hole 399 by a retaining plate 404, which is fastened to the cam plate 380 with screw fasteners 405. The second shaft portion 392b includes opposing threaded ends 406a, 406b. A first threaded end 406a engages corresponding threads 407 in the handle 386 to connect the handle 386 to the second shaft portion 392b. A second threaded end 406b extends through a hole 408 in the retaining plate 404 and engages corresponding threads (not shown) in the first shaft portion 392a, thereby connecting the second shaft portion 392b to the cam plate 380.

Referring still to FIGS. 6A and 6B, the handle 386 is displaceable relative to the hub lever 388 between an engaged position in which the handle 386 mechanically engages the hub lever 388, thereby inhibiting rotational movement of the cam plate 380, and a disengaged position in which the handle 386 is operable to control rotational movement of the cam plate 380. In particular, the handle 386 is resiliently biased by the spring 402 toward a position in which the stem 396 extends outwardly from the through hole 400 in the cam plate 380 and into contact with the hub lever 388. As shown in FIG. 6A, the hub lever 388 includes a pair of apertures 409a, 409b. A first one of the apertures 409a corresponds to a position of the handle 386 when the pull-down ramps 360a-d are in a fully refracted position, and a second one of the apertures 409b corresponds to a position of the handle 386 when the pull-down ramps 360a-d are in a fully extended position. Thus, the handle 386 locks into the hub lever 388 after moving the pull-down ramps 360a-d from the fully retracted to the fully extended position or vice-versa. The handle 386 can be disengaged from the hub lever 388 by applying a force (e.g., pulling) on the handle 386 in a direction away from the hub lever 388 (as indicated by arrow 410), thereby compressing the spring 402 between the shoulder 398 and the retaining plate 404 and moving the stem 396 out of contact with the hub lever 388. The handle 386 and second shaft portion 392b can also be separated from the cam plate 380 by unscrewing the second shaft portion 392b from the first shaft portion 392a. As shown, for example, in FIG. 4A, the docking plate 352 includes storage clips 412 for connecting to the second shaft portion 392b and storing the handle 386 when disengaged from the com plate 380, e.g., during testing.

Figure 4C:
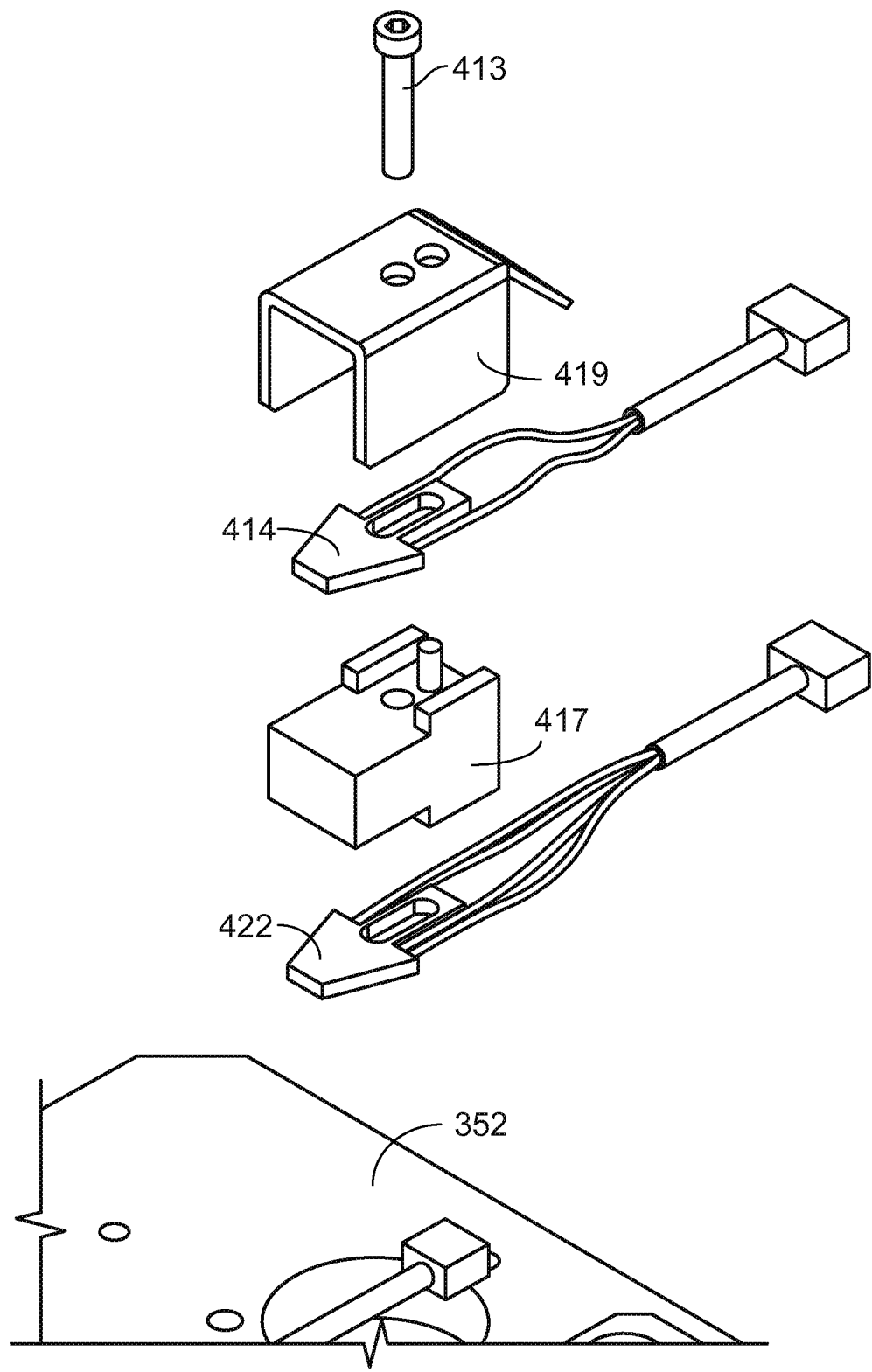
FIG. 4C is an exploded assembly view showing a capture position sensor and a docked position sensor.

Referring again to FIGS. 4A, 4B and 5, the docking device 350 also includes capture position sensors 414, which are mounted to the first surface 354 of the docking plate 352. As shown in FIG. 4C, each of the capture position sensors 414 is mounted to a stand-off block 417 which spaces the sensors 414 a predetermined distance from the first surface 354 of the docking plate 352. For each of the capture position sensors 414, a cover plate 419 covers and protects the sensor 414, and a faster 413 secures the cover plate 419, the sensor 414, and the stand-off block 417 to the docking plate 352.

The capture position sensors 414 are operable to detect a presence of the DIB assembly 310 in a capture position in which the cam surfaces 366 (e.g., internal surfaces) of the pull-down ramps 360a-d are substantially aligned with the cam followers 324 of the DIB assembly 310 such that the pull-down ramps 360a-d are moveable to engage the cam surfaces 366 with the cam followers 324 of the DIB assembly 310. The capture position sensors 414 are electrically connected to electronics 415 in a display panel 416 (FIG. 4A) mounted to the docking plate 352. The electronics 415 are powered by an external power supply 417 (FIG. 4B) connected via connector 419. Cable conduits 418 are mounted to the first surface 354 of the docking plate 352 and allow for the routing of electrical wires and cables, such as those connecting the capture position sensors 414 and the display panel 416, around the outer edges of the docking plate 352. The display panel 416 is configured to provide a visual indication to signal a detected presence of the DIB assembly 310 in the capture position based on signals received from the capture position sensors 414. For example, as shown in FIG. 4A, the display panel 416 includes four light emitting diodes (LEDs) 420 each corresponding to one of the capture position sensors 414. The LEDs 420 light up or change color when an associated one of the capture position sensors 414 detect the presence of the corresponding alignment bracket 322 of the DIB assembly 310 in the capture position. The capture position sensors 414 are reflective sensors which detect reflective surfaces 340 (FIG. 3) on the DIB assembly 310 when the DIB assembly 310 is in the capture position.

The docking device 350 also includes a docked position sensor 422 that is connected to the docking plate 352. Referring again to FIG. 4C, the docket position sensor 422 is mounted to the docking plate 352 in a position below one of the capture position sensors 414 and spaced apart from the capture position sensor 414 by the stand-off block 417. As mentioned above, the pull-down ramps 360a-d are operable to displace the DIB assembly 310 from the capture position toward a docked position such that the DIB assembly 310 is closer to the docking plate 352 in the docked position. The docked position sensor 422 is operable to detect a presence of the DIB assembly 310 in the docked position. The docked position sensor 422 is electrically connected to electronics 415 the display panel 416. The display panel 416 is configured to provide a visual indication to signal a detected presence of the DIB assembly 310 in the docked position based on signals received from the docked position sensor 422. For example, as shown in FIG. 4A, the display panel 416 also includes a fifth LED 424 that corresponds to the docked position sensor 416. The fifth LED 424 lights up or changes color when the docked position sensor detects the presence of a corresponding one of the alignment brackets 322 of the DIB assembly 310 in the docked position. The docked position sensor 422 is a reflective sensor which detects the reflective surface 340 of a corresponding one of the alignment brackets 322 on the DIB assembly 310 when the DIB assembly 310 is in the docked position.

Figure 7A:
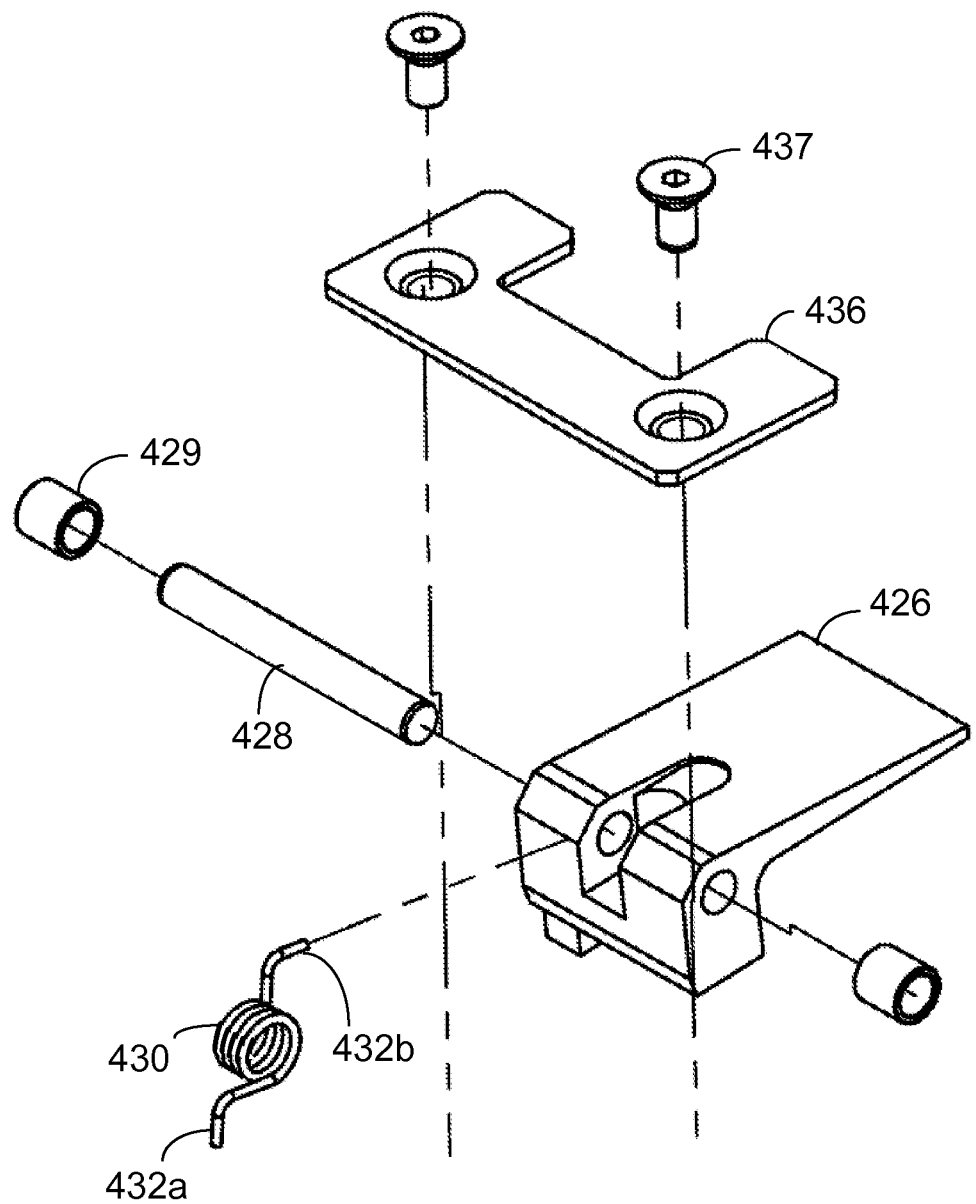
FIGS. 7A-7C are perspective views of a safety interlock assembly.
Figure 7B:
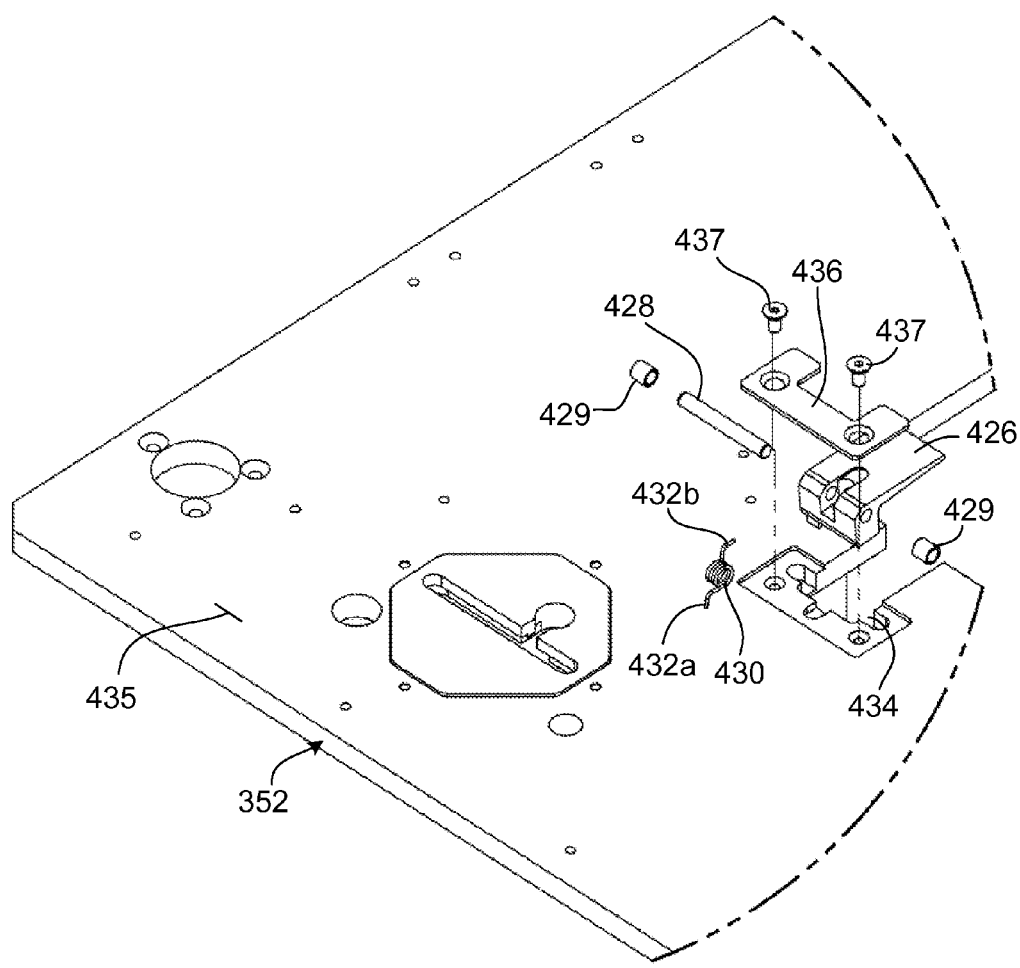

The docking device 350 also includes a safety interlock mechanism that inhibits movement of the pull-down ramps 360a-d in certain situations. For example, the safety interlock mechanism can be configured to inhibit movement of the pull-down ramps 360a-d if the test head 110 is disconnected from the DIB assembly 310 while the DIB assembly 310 is connected to the handler 200 via the docking device 350. This, for example, can help to reduce the risk of the DIB assembly 310 being released from the docking device 350 when the test head 110 is not present, and, as a result may help to reduce the risk of the DIB assembly 310 falling and being damaged. The safety interlock mechanism includes a safety interlock bracket 426. The safety interlock bracket 426 is rotatably mounted to the docking plate 352. For example, as shown in FIGS. 7A and 7B, the safety interlock bracket 426 is mounted on a dowel pin 428, which is flanked on either side by a bushing 429. A torsion spring 430 is carried by the dowel pin 428. At a first end 432a the torsion spring 430 applies a force to the docking plate 352, and a second end 432b the torsion spring 430 applies a force to the safety interlock bracket 426. During assembly, the dowel pin 428 and bushings 429 are placed into a partial slot 434 that is formed at a second surface 435 of the docking plate 352 and are held in place there by a cover plate 436 that is fastened (e.g., by screw fasteners 437) to the second surface 435 of the docking plate 352.

Figure 7C:
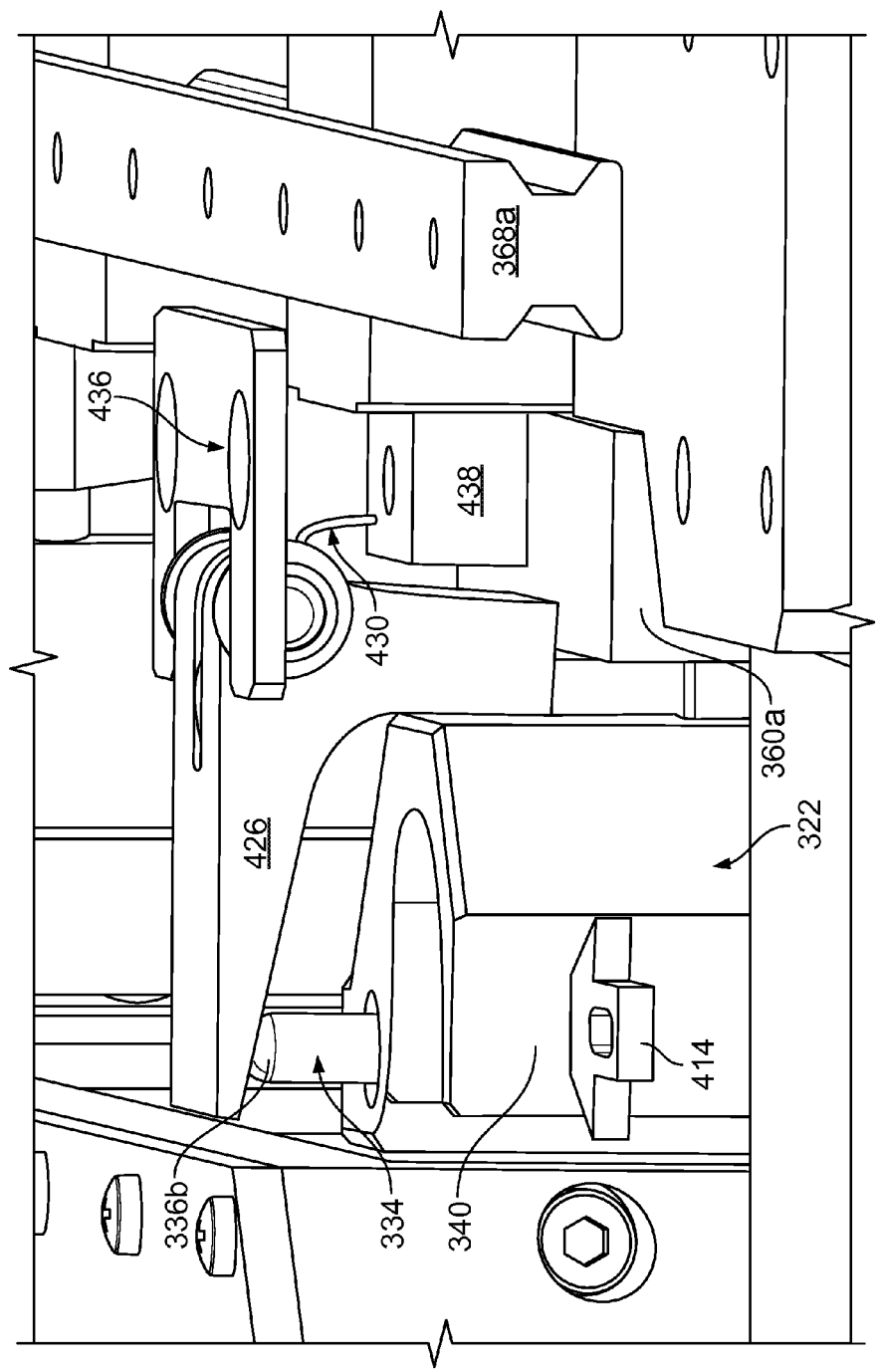

As shown in FIG. 7C (docking plate 352 not shown), the first pull-down ramp 360a includes a stop block 438. The safety interlock bracket 426 is rotatable between a locked position in which the safety interlock bracket 426 mechanically engages the stop block 438 first pull-down ramp 360a, thereby substantially inhibiting linear movement of the pull-down ramps 360a-d, and an unlocked position (as shown in FIG. 7C) in which the interlock bracket 426 is disengaged from the stop block 438 of the first pull-down ramp 360a and does not substantially inhibit movement of the pull-down ramps 360a-d. The safety interlock bracket 426 is resiliently biased towards the locked position due the forces exerted on it by the torsion spring 430.

Referring still to FIG. 7C, when the DIB assembly 310 is connected with both the docking device 350 and the test head 110, the spring loaded pin 334 is displace toward the second position in which the second end 336b of the pin 334 extends outwardly from the second surface 332 of the alignment bracket 322 and engages the safety interlock bracket 426, thereby rotating the safety interlock bracket 426 to the unlocked position.

Laser Assisted Alignment

Figure 8A:
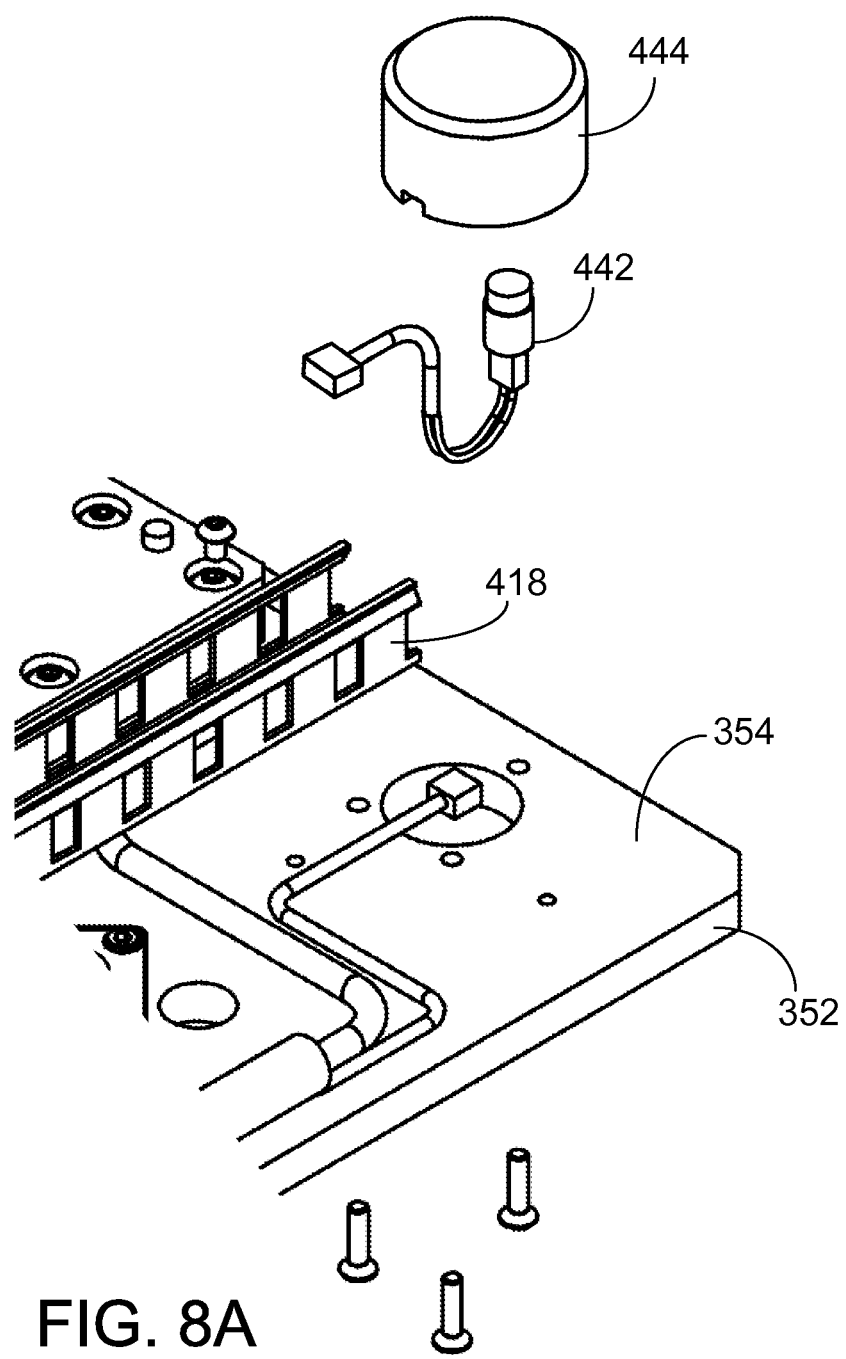
FIG. 8A is perspective view of a laser assembly.

The ATE system can also include a laser assisted alignment system. For example, as shown in FIGS. 4A, 4B and 5, the docking device 350 can include laser assemblies 440 mounted to the first surface 354 of the docking plate 352. As shown in greater detail in FIG. 8A, the laser assemblies 440 generally include a laser device 442 and a mounting bracket 444 for connecting the laser device 442 to the docking plate 352. The laser devices 442 are electrically connected to the electronics 415 in the display 416. The electronics 415 are configured to turn the laser devices 442 off when the docked position sensor 422 provides a signal indicating that the DIB assembly 310 is in a docked position.

Figure 8B:
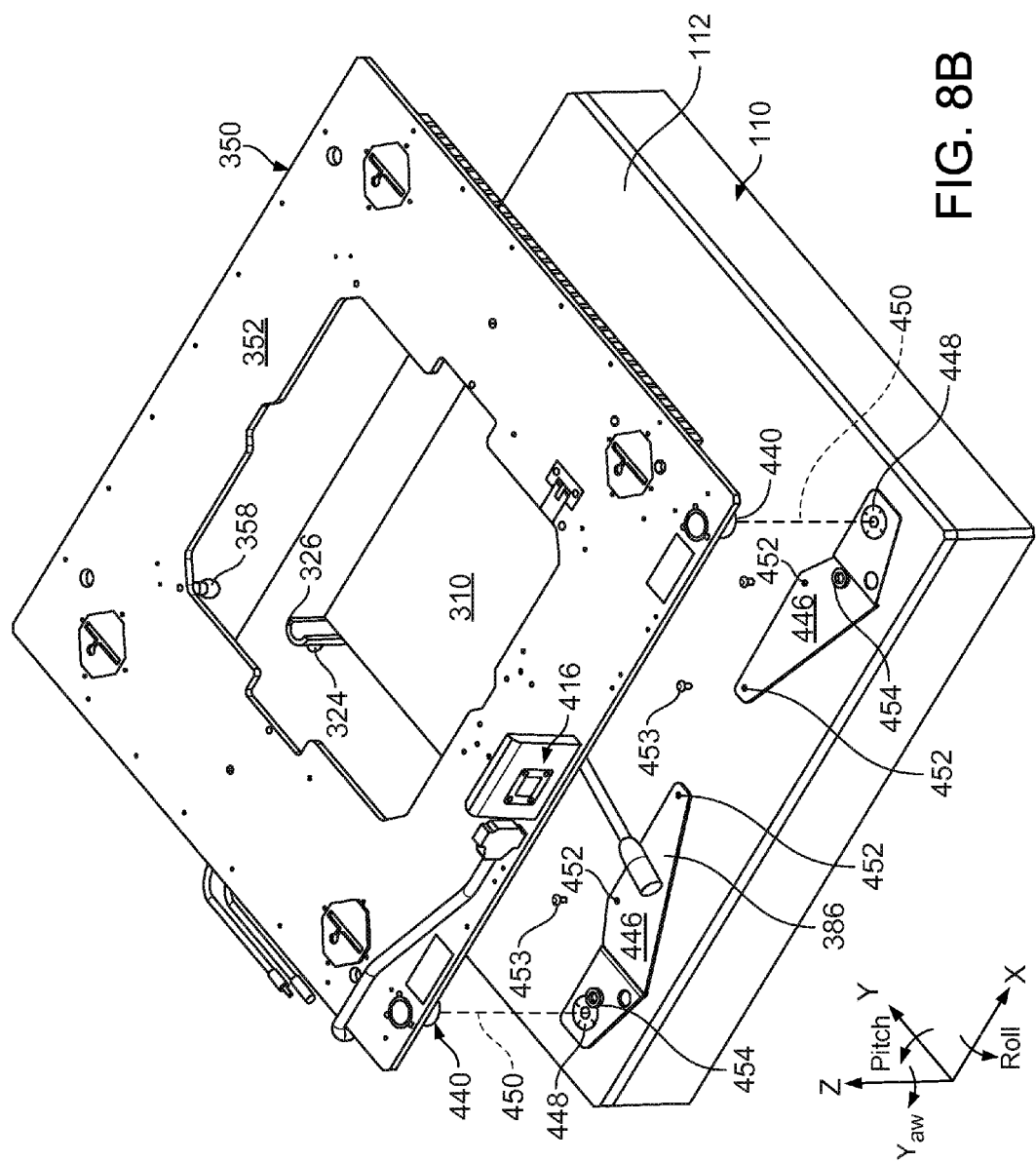
FIG. 8B is perspective view of a laser assisted alignment system.

As shown in FIG. 8B, the laser assisted alignment system also includes a pair of target plates 446. The target plates 446 can be sheet metal plates with printed (e.g., silk screen, anodize, etc.) target symbols 448. The target plates 446 are mounted to the top surface 112 of the test head 110 and are arranged to correspond with the position of the laser assemblies 440 on the docking device 350 such that, when laser beams 450 from the laser assemblies 440 are aligned with the target symbols 448, the rough alignment pins 358 on the docking plate 352 are substantially aligned with the alignment bushings 326 of the DIB assembly 310 mounted on the test head 110.

The target plates 446 include mounting holes 452 for mounting the target plates 446 to the test head 110 with fasteners 453. The target plates 446 also include spirit levels 454. The spirit levels 454 provide for alignment in an additional two degrees of freedom by centering the bubbles in the spirit levels 454. In particular, merely aligning the laser beams 450 from the laser assemblies 440 with the target symbols 448 alone aligns the test head 110 and connected DIB assembly 310 with the docking device 350 in three degrees of freedom including X, Y, and Yaw. However, the inclusion of the spirit levels 454 also allows for alignment in Pitch and Roll.

Methods of Operation

In general, the system operates as follows.

The DIB assembly 310 is mounted to the surface 112 of the test head 110, and the docking device 350 is mounted to the surface 212 (FIG. 2) of the handler 200. The test head 110, with the DIB assembly 310 attached, is then aligned with the docking device 350. Alignment can be performed visually by aligning, e.g., by sight, the rough alignment pins 358 of the docking device 350 with the alignment bushings 326 of the DIB assembly 310. Alternatively or additionally, alignment can be performed with the aid of the laser assisted alignment system by aligning laser beams 450 from the laser assemblies 440 on the docking device 350 with the target symbols 448 on the test head 110, as described above, e.g., with regard to FIG. 8B. As mentioned above, the manipulator 120 allows for the positioning of the test head 110 and provides six (6) degrees of freedom for precise alignment. Once the test head 110 is substantially aligned with the handler 200 the test head 110 can be moved toward the handler 200 such that the rough alignment pins 358 of the docking device 350 engage the alignment bushings 326 of the DIB assembly 310, and until the cam followers 324 are substantially aligned with the cam surfaces 366 of the pull-down ramps 360a-d, e.g., as will be indicated by the display 416. Once the cam followers 324 are aligned with the cam surfaces 366 (i.e., the capture position), the pull-down ramps 360a-d can be displaced from the retracted position to the extended position by moving the handle 386 from a first position corresponding to the refracted position of the pull-down ramps 360a-d toward a second position corresponding to the extended position of the pull-down ramps 360a-d, thereby pulling the DIB assembly 310 towards the docking plate 352 and into a docked position with the handler 200. Once the test head 110 and the attached DIB assembly 310 are docked with the handler 200 a test sequence can be executed during which the handler 200 delivers devices to the socket 316 of the DIB assembly 310 while the tester 100 generates and measures electrical signals to determine whether the particular DUT is properly functioning.

Other Embodiments

Other embodiments are within the scope of the following claims.

Figure 9:
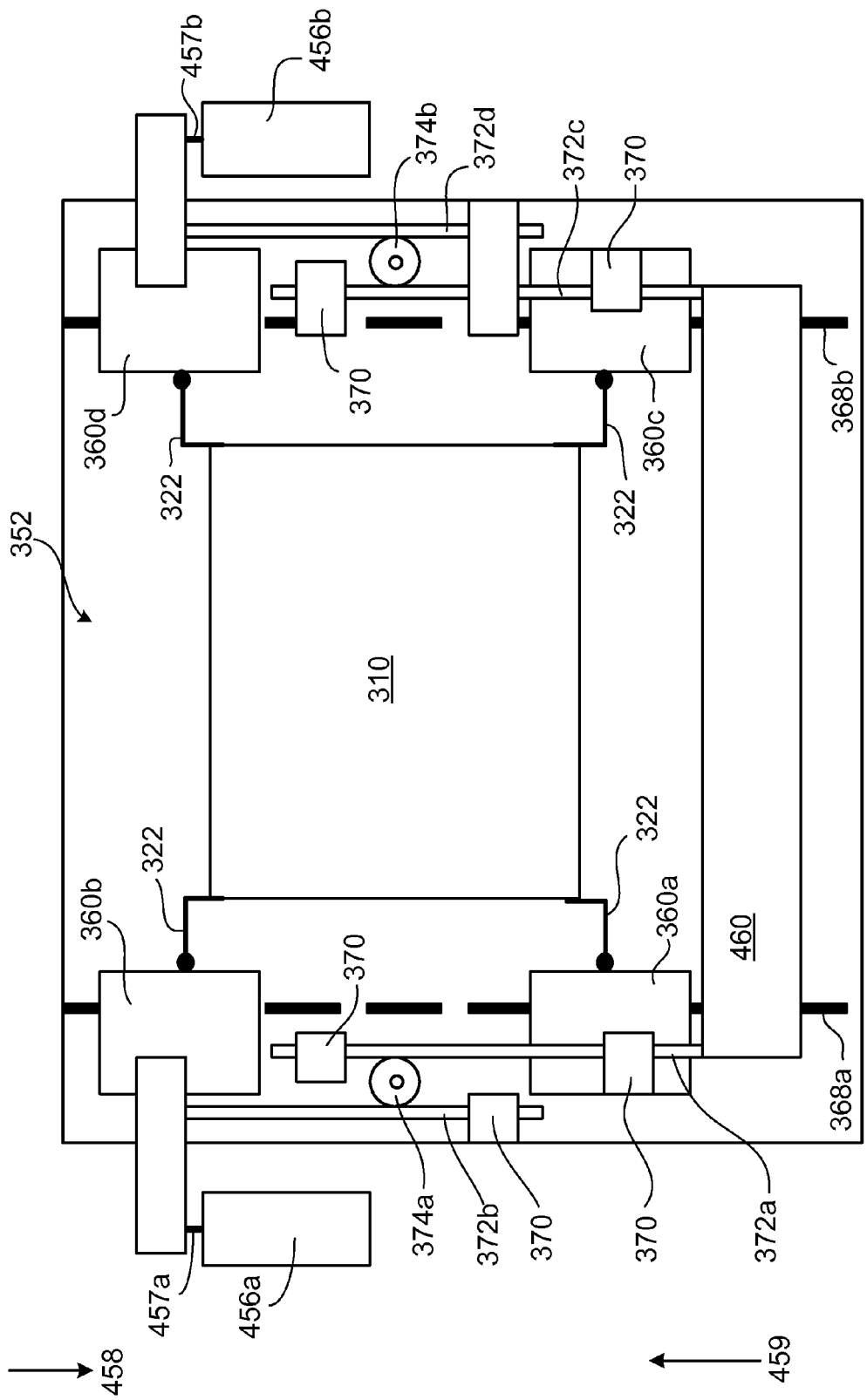
FIGS. 9-14 show different embodiments of a docking device.

For example, while the interface systems described above include a particular mechanisms for controlling movement of the pull-down ramps, the systems can also include other mechanisms for inducing movements of the pull-down ramps. For example, in the embodiment depicted in FIG. 9, movement of the pull-down ramps 360a-d is actuated pneumatically. As shown in FIG. 9, pneumatic cylinders 456a, 456b include pistons 457a, 457b which are connected to the second and fourth pull-down ramps 360b, 360d. As in the embodiment described above, the second pull-down ramp 360b is mechanically connected to the first pull-down ramp 360a via the first and second gear racks 372a, 372b and the first pinion gear 374a. Thus, movement of the second pull-down ramp 360b in a first direction (arrow 458), e.g., induced by the cylinder 456a, will result in movement of the first pull-down ramp 360a in a second, opposite direction (arrow 459). Similarly, the fourth pull-down ramp 360d is mechanically connected to the third pull-down ramp 360c via the third and fourth gear racks 372c, 372d and the second pinion gear 374b. Thus, movement of the fourth pull-down ramp 360d in the first direction (arrow 458), e.g., induced by the cylinder 456b, will result in movement of the third pull-down ramp 360c in the second direction (arrow 459). The first and third gear racks 372a, 372c are connected by a first connecting plate 460 which can aid in stabilizing the system and synchronize movements of the pull-down ramps 360a-d.

Figure 10:
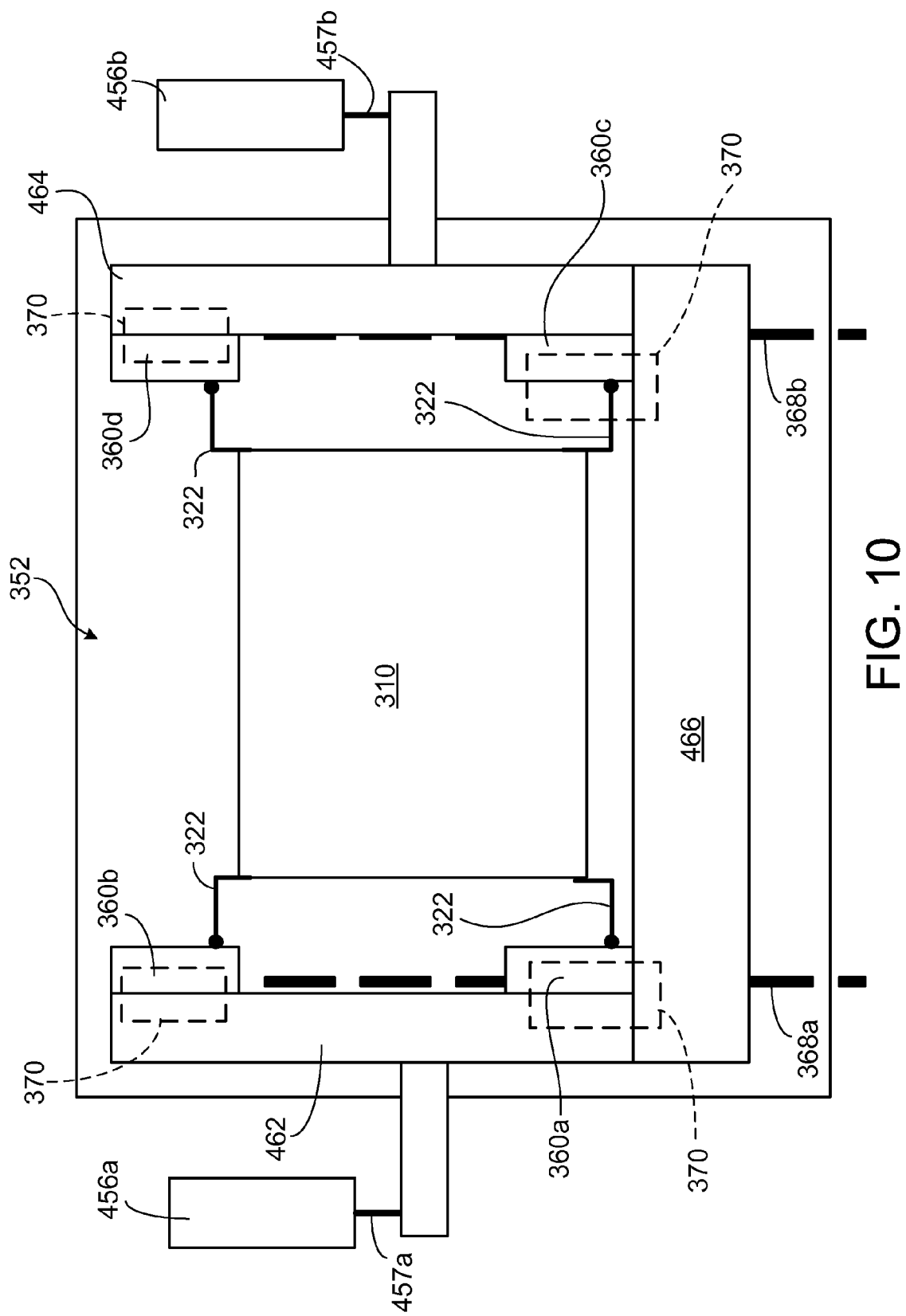

FIG. 10 illustrates another embodiment in which the first and second pull-down ramps 360a, 360b are rigidly connected to each other with a first connecting member 462. Similarly, the third and fourth pull-down ramps 360c, 360d are rigidly connected to each other with a second connecting member 464. A first pneumatic cylinder 456a includes a piston 457a that is connected to the first connecting member 462 for driving the first connecting member 462 and the connected first and second pull-down ramps 360a, 360b in linear motions along a first linear bearing 368a. A second pneumatic cylinder 456b includes a piston 457b that is connected to the second connecting member 464 for driving the second connecting member 464 and the connected third and fourth pull-down ramps 360c, 360d in linear motions along a second linear bearing 368b. The first and second connecting members 462, 464 are rigidly connected with a third connecting member 466 which can aid in stabilizing the system and synchronize movements of the pull-down ramps 360a-d.

Figure 11:
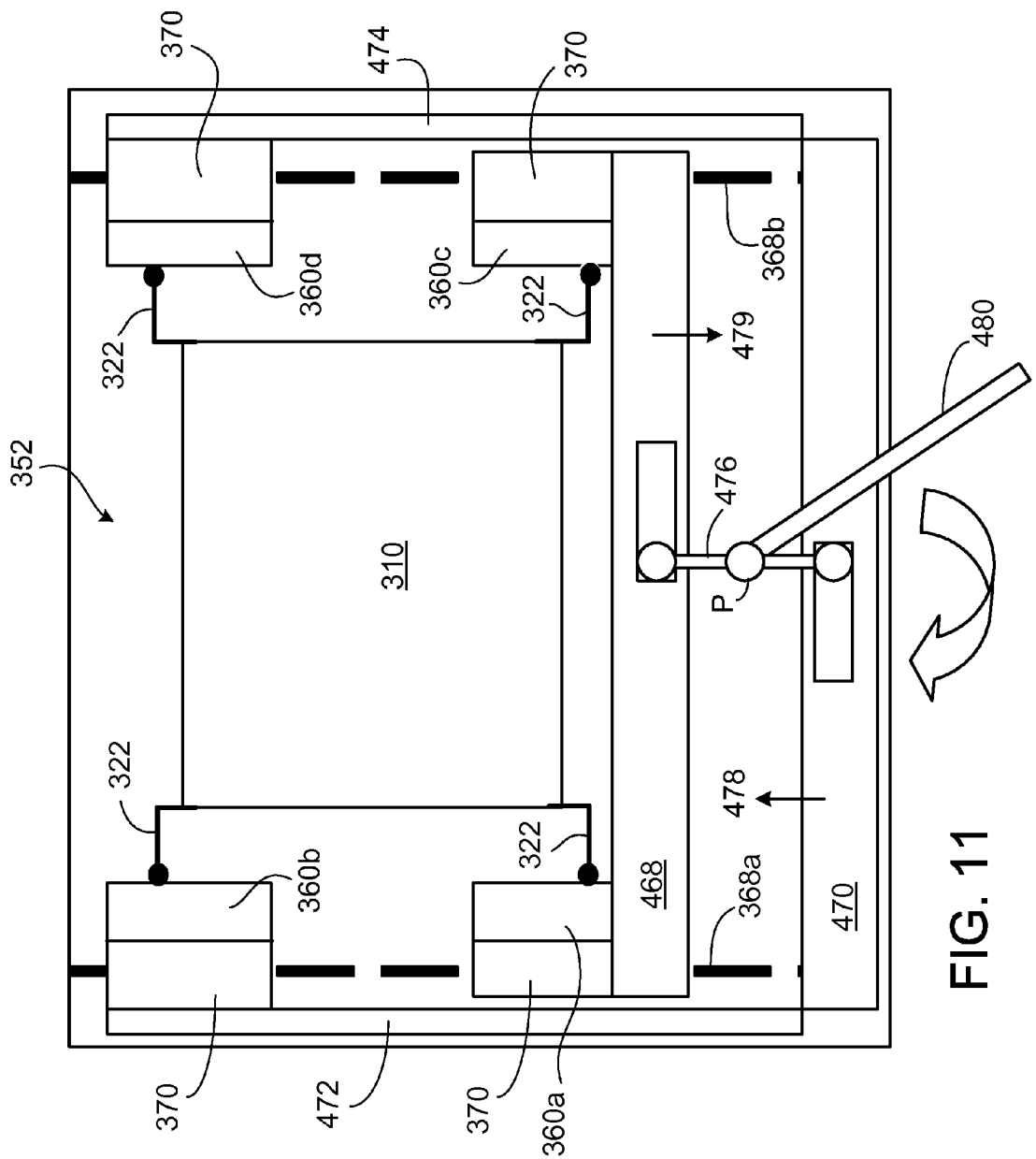

FIG. 11 illustrates another implementation in which the first and third pull-down ramps 360a, 360c are rigidly connected to each other with a first drive plate 468. The second pull-down ramp 360b is connected to a second drive plate 470 by a first connecting member 472. The fourth pull-down ramp 360d is connected to the second drive plate 470 by a second connecting member 474. The first and second drive plates 468, 470 are connected to each other by a linkage 476. The linkage 476 is rotatable about point P to drive the first and second drive plates 468, 470 and their associated ones of the pull-down ramps 360a-d in linear motions of opposite directions (as indicated by arrows 478, 479) along first and second linear bearings 368a, 368b. An actuation lever 480 is connected to and controls movement of the linkage 476.

Figure 12:
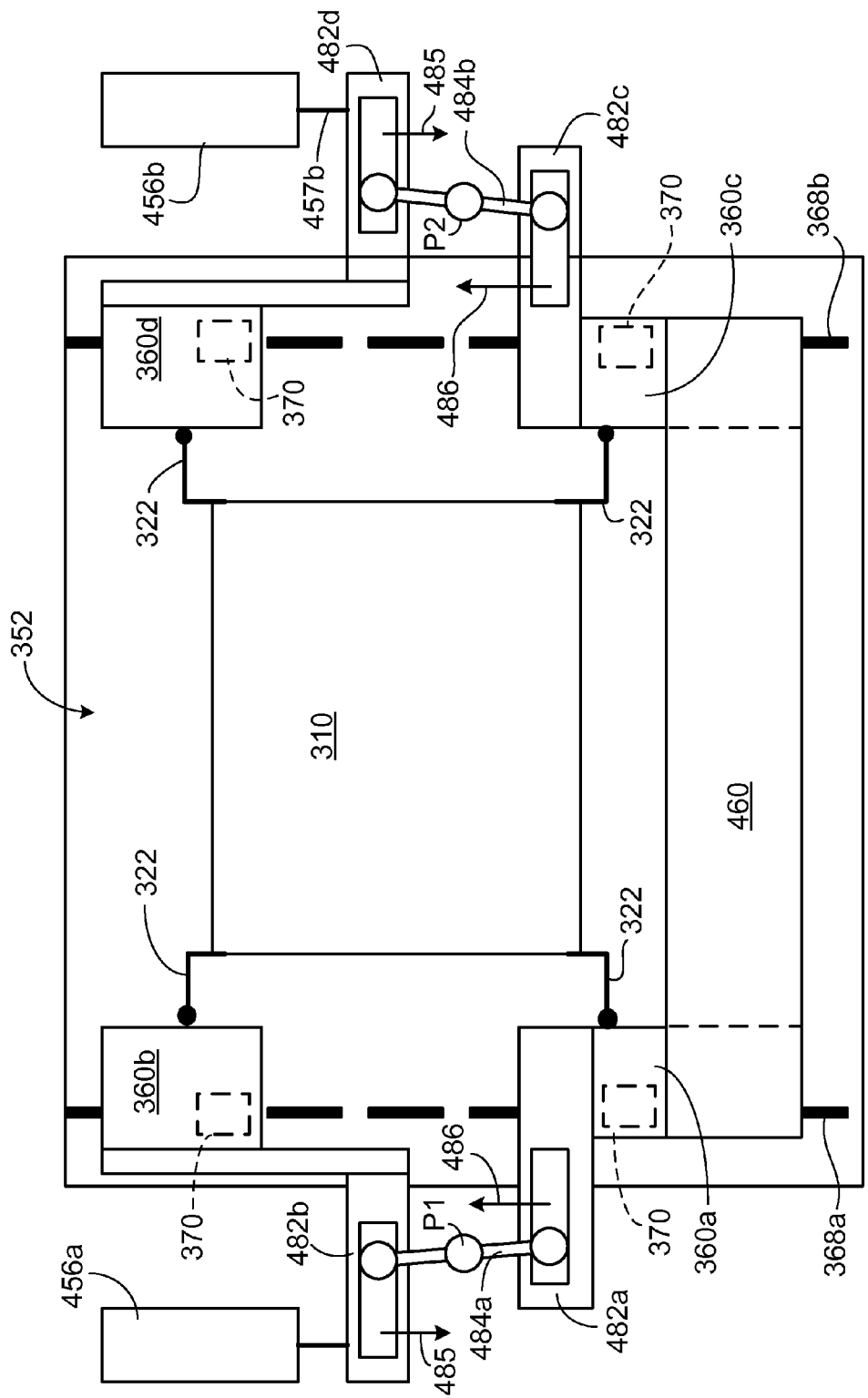

FIG. 12 illustrates another embodiment in which each of the pull-down ramps 360a-d is connected to an associated drive plate 482a-d. First and second drive plates 482a, 482b are mechanically connected by a first linkage 484a. The first linkage 484a is rotatable about point P1 to translate linear motions of the second drive plate 482b and second pull-down ramp 360b to corresponding linear motions of the first drive plate 482a and first pull-down ramp 360a in opposite directions (as indicated by arrows 485, 486). A first pneumatic cylinder 456a includes a piston 457a that is connected to the second drive plate 482b for driving the first and second pull-down ramps 360a, 360b along the first linear bearing 368a.

Similarly, referring still to FIG. 12, third and fourth drive plates 482c, 482d are mechanically connected by a second linkage 484b. The second linkage 484b is rotatable about point P2 to translate linear motions of the fourth drive plate 482d and fourth pull-down ramp 360d to corresponding linear motions of the third drive plate 482c and third pull-down ramp 360c in opposite directions (as indicated by arrows 485, 486). A second pneumatic cylinder 456b includes a piston 457b that is connected to the fourth drive plate 482d for driving the third and fourth pull-down ramps 360c, 360d along the second linear bearing 368b.

Figure 13:
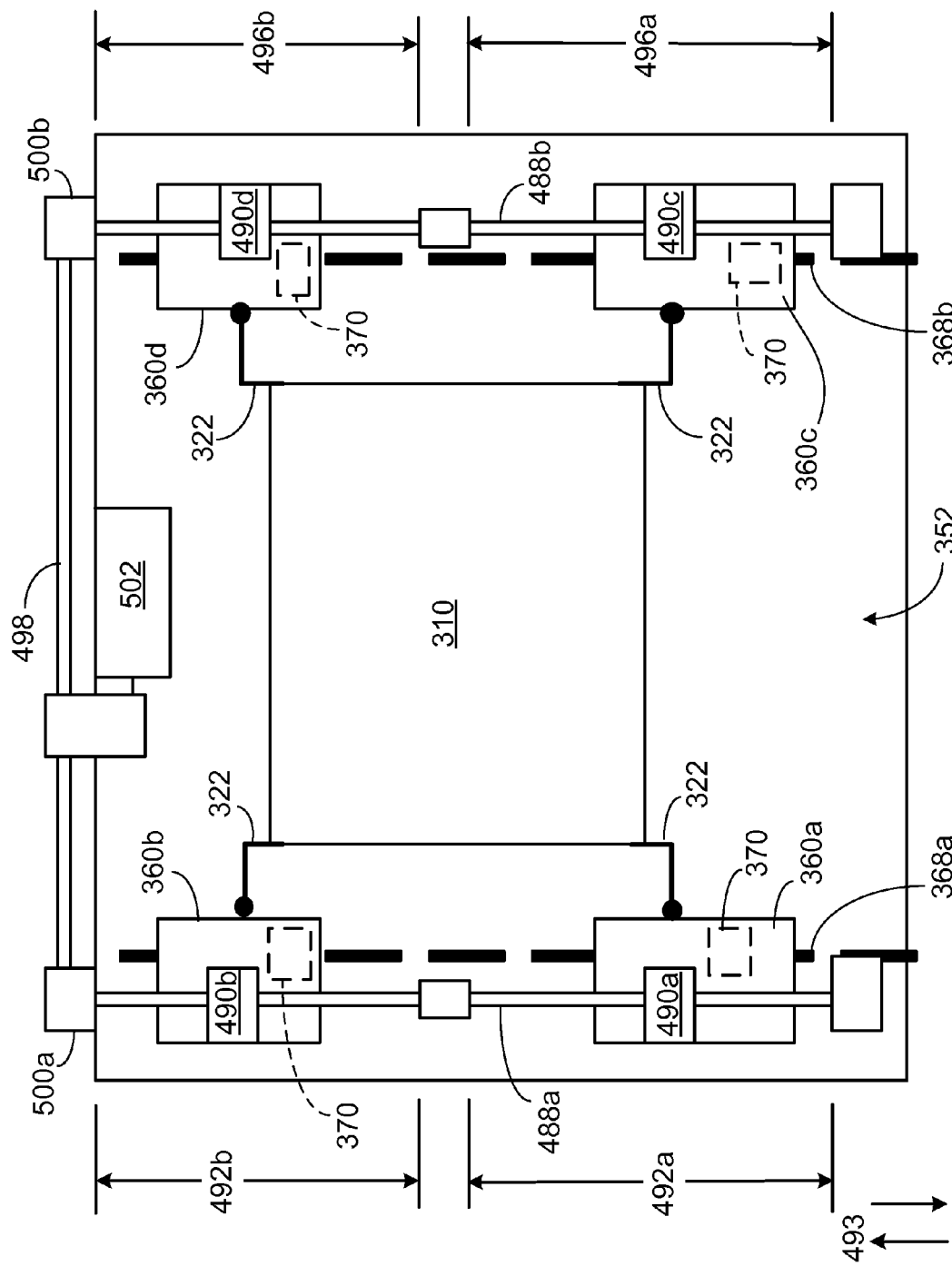

FIG. 13 illustrates yet another implementation in which a pair of linear bearings 368a, 368b are mounted to the docking plate 352. Each of the linear bearings 368a, 368b include bearing blocks 370, which are linearly displaceable along the bearings 368a, 368b. Each of the pull-down ramps 360a-d is connected to an associated one of the bearing blocks 370. On a first side of the docking plate 352 a first lead screw 488a is rotatably mounted to the docking plate 352. First and second nuts 490a, 490b are mounted to the first lead screw 488a. A first one of the pull-down ramps 360a is connected to the first nut 490a, and a second one of the pull-down ramps 360b is connected to the second nut 490b. Rotational movement of the first lead screw 488a induces linear movement of the first and second nuts 490a, 490b causing the first and second pull-down ramps 360a. 360b to move along the first linear bearing 368a. In the embodiment shown, the first lead screw 488a includes a first region 492a on which the first nut 490a is mounted, and a second region 492b on which the second nut 490b is mounted. The first region 492a has a first thread direction and the second region 492b has a second thread direction that is opposite the first thread direction. Thus, rotational movement of the first lead screw 488a induces linear movement of the first and second nuts 490a, 490b in opposite directions (as indicated by arrows 493, 494).

Similarly, on a second side of the docking plate 352, a second lead screw 488b is rotatably mounted to the docking plate 352. Third and fourth nuts 490c, 490d are mounted to the second lead screw 488b. A third one of the pull-down ramps 360c is connected to the third nut 490c, and a fourth one of the pull-down ramps 360d is connected to the fourth nut 490d. Rotational movement of the second lead screw 488b induces linear movement of the third and fourth nuts 490c, 490d causing the third and fourth pull-down ramps 360c, 360d to move along the second linear bearing 368b. In the embodiment shown, the second lead screw 488b includes a first region 496a on which the third nut 490c is mounted, and a second region 496b on which the fourth nut 490d is mounted. The first and second regions 496a, 496b have threads of opposite direction such that rotational movement of the second lead screw 488b induces linear movement of the third and fourth nuts 490c, 490d in opposite directions (as indicated by arrows 493, 494).

Figure 14:
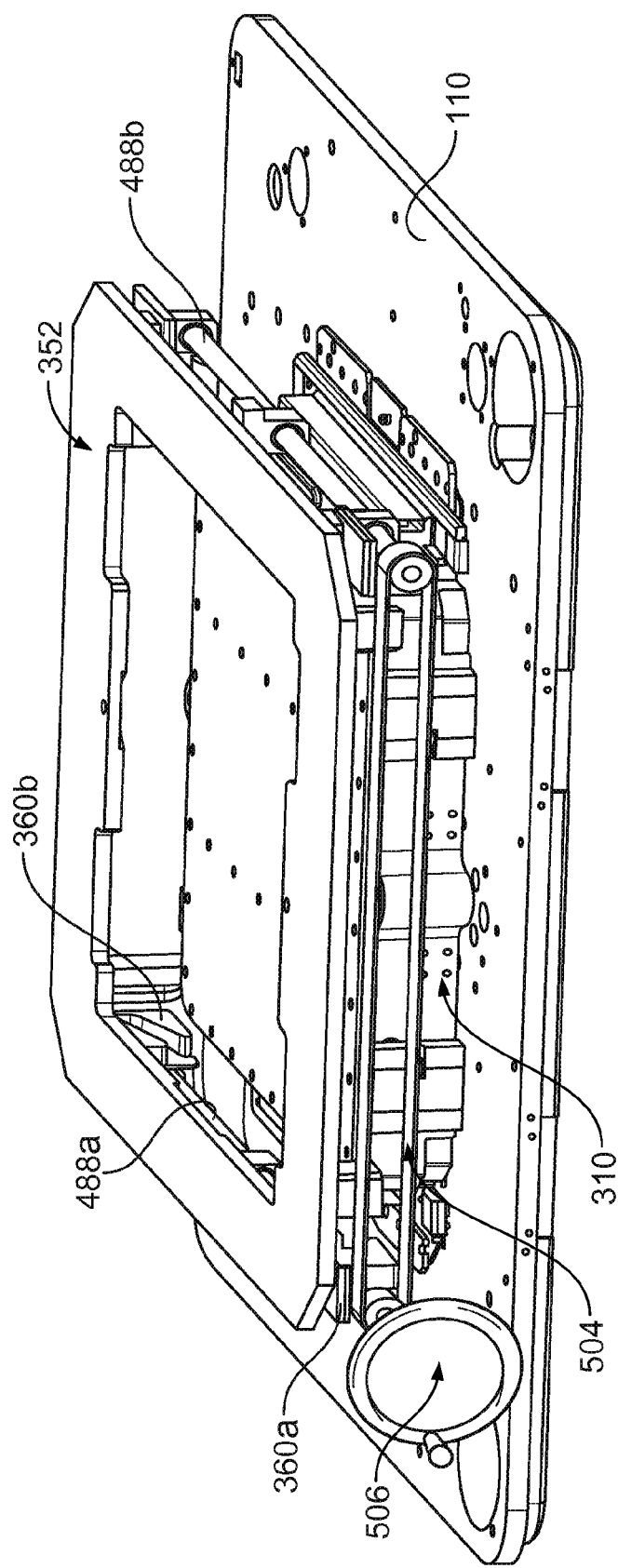

As shown in FIG. 13, the first and second lead screws 488a, 488b are mechanically interconnected such that movements of the first, second, third and fourth nuts 490a-d and the associated pull-down ramps 360a-d are substantially synchronized. For example, as shown in FIG. 13, the first and second lead screws 488a, 488b are both attached to a common drive shaft 498 through a pair of bevel gears 500a, 500b. A motor 502 drives the drive shaft 498 which, in turn, drives the leads screws 488a, 488b. Alternatively or additionally, referring to FIG. 14, the first and second lead screws 488a, 488b can be mechanically interconnected with a drive belt 504. As shown in FIG. 14, a rotatable handle actuator 506 is connected to the first lead screw 488a for manual rotation of the first lead screw 488a, and rotational movement of the first lead screw 488a is translated to the second lead screw 488b through the drive belt 504.

Figure 15:
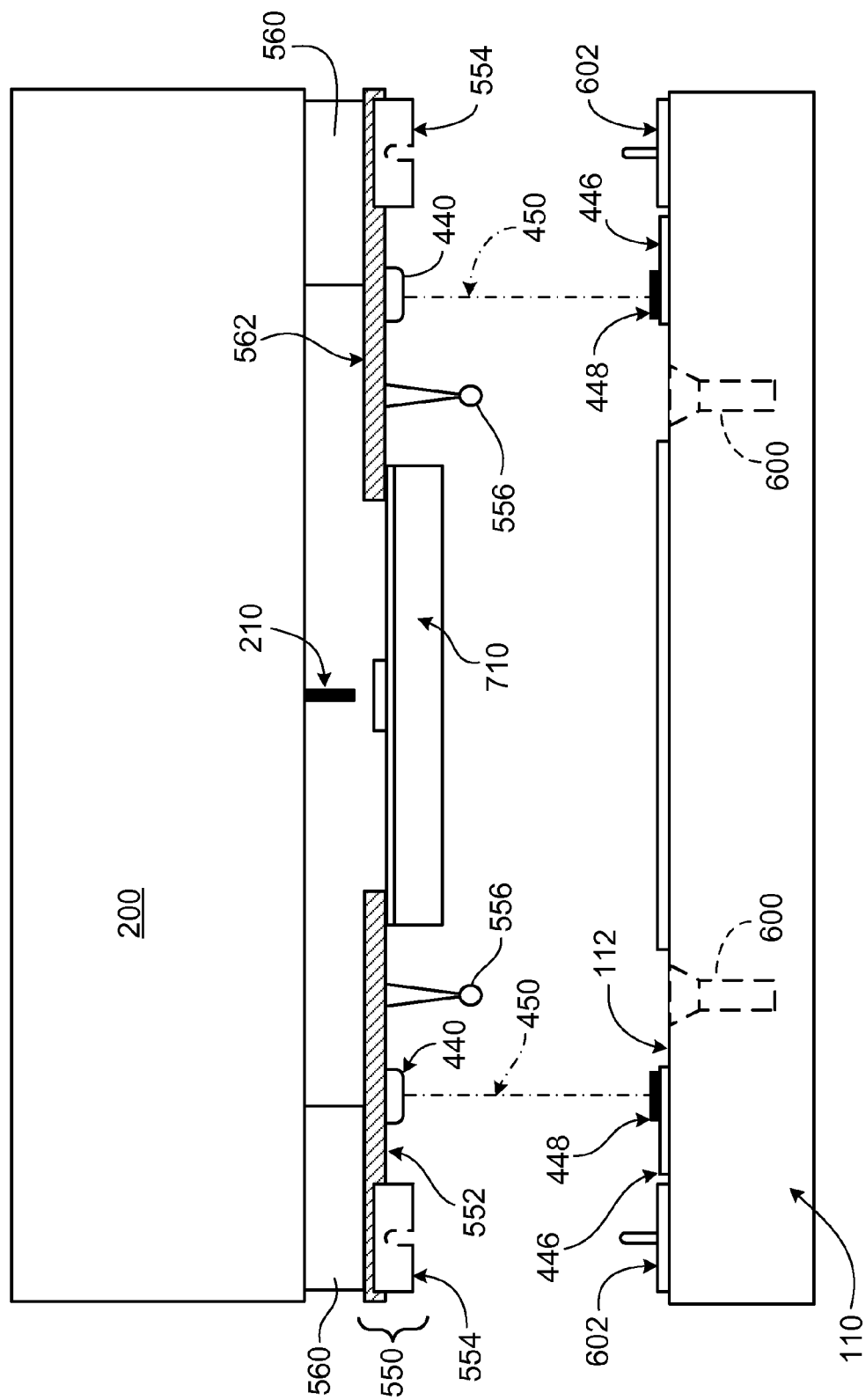
FIG. 15 shows an automated test equipment (ATE) system with a laser assisted alignment system.

Furthermore, although one embodiment of a laser assisted alignment system was described above with regard to a particular embodiment of an ATE system, other embodiments are possible. As shown in FIG. 15, a docking device 550 includes a docking plate 552 having receptacles 554 and rough alignment pins 556 mounted to a first surface 558 of the docking plate 552. The docking device 550 also includes Z-blocks 560 mounted to a second surface 562 of the docking plate 552. The docking plate 552 is mounted to a peripheral, e.g., handler 200, and the Z-blocks 560 establish the z-stack value.

The test head 110 includes alignment bushings 600 which are arranged in a pattern corresponding to the rough alignment pins 556 on the docking plate 552 and which are configured to engage the rough alignment pins 556 for alignment of the test head 110 with the docking device 550. The test head 110 also includes outer pull-down modules 602 which are pneumatic cylinders that are configured to anchor into the receptacles 554 on the docking plate 552 and then pull the test head 110 towards the handler 200.

In the embodiment shown in FIG. 15, the target plates 446 are mounted to the top surface of the test head 112 and are arranged to correspond with the position of laser assemblies 440 on the docking device 550 such that, when laser beams 450 from the laser assemblies 440 are aligned with the target symbols 448 on the target plates 446, the rough alignment pins 556 on the docking plate 552 are substantially aligned with the alignment bushings 600 on the test head 110 itself. In particular, FIG. 15 illustrates an embodiment in which a DIB assembly 710 is first mounted to the docking device 550, and then the test head 110 is aligned with the docking device 550 and subsequently docked to the docking device 550 and then to the DIB assembly 710.

FIG. 16 illustrates another implementation on a laser assisted alignment system in which the target plates 446 are attached to the docking plate 552 on a handler 202 and the laser assemblies 440 are attached to the top surface 112 of the test head 110. This may be particularly desirable for situations in which the test head 110 is to be aligned with a vertically oriented handler 200, as shown in FIG. 16, for testing in a vertical orientation. In such situations, an operator 800 will generally have to stand behind the test head 110 and manipulator 120 facing toward the mating surface of the peripheral in order to align the test head 110 with the peripheral. Locating the laser assemblies 440 on the test head 110 can reduce the likelihood that laser beams 450 from the laser assemblies 440 will come in contact with the operators eyes in this situation.

Although some of the embodiments and implementations described above make particular reference to handlers, the laser assisted alignment systems can be used in the same manner with other peripherals such as probers.

Elements of different embodiments may be combined to form combinations not specifically described herein.

The claims are not limited to the embodiments described herein.

What is claimed is:
1. An automated test equipment system comprising:
   a peripheral comprising first mechanical alignment features;
   a test head comprising second mechanical alignment features arranged in a pattern corresponding to the first mechanical alignment features and configured to engage the first mechanical alignment features;

a laser assisted alignment system comprising:

target plates mounted to the peripheral and comprising target symbols visible on surfaces of the target plates, and laser devices mounted to the test head and operable to emit laser beams, wherein the laser devices are arranged in a pattern corresponding to the target symbols such that, when laser beams from the laser devices are substantially aligned with the target symbols, the first mechanical alignment features are substantially aligned with the second mechanical alignment features; and wherein the laser assisted alignment system is configured to provide for alignment of the first mechanical alignment features with the second mechanical alignment features in five degrees-of-freedom.

2. The automated test equipment system of claim 1, wherein the peripheral comprises a first surface and a docking plate mounted to the first surface, and wherein the first mechanical alignment features are mounted to the docking plate.

3. The automated test equipment system of claim 2, wherein the target plates are mounted to the docking plate.

4. The automated test equipment system of claim 1, wherein the test head comprises a first surface, and a device interface board assembly (DIB) assembly mounted to the first surface, and wherein the second mechanical alignment features are mounted to the DIB assembly.

5. The automated test equipment system of claim 4, wherein the laser devices are mounted to the first surface of the test head in positions spaced apart from the DIB assembly.

6. The automated test equipment system of claim 1, wherein the target plates comprise spirit levels.

7. The automated test equipment system of claim 1, wherein the first mechanical alignment features comprise alignment pins, and wherein the second mechanical alignment features comprise bushings configured to engage the alignment pins.

8. The automated test equipment system of claim 1, wherein the peripheral is selected from the group consisting of a handler and a prober.

9. The automated test equipment system of claim 1, wherein the peripheral is a vertically oriented peripheral configured for testing electronic components in a vertical orientation.

* * * * *